US010118377B2

(12) United States Patent
Castanon

(10) Patent No.: US 10,118,377 B2
(45) Date of Patent: Nov. 6, 2018

(54) STEREOLITHOGRAPHY SYSTEM

(71) Applicant: Forcast Research and Development Corp., Prince George OT (CA)

(72) Inventor: Diego Castanon, Burnaby (CA)

(73) Assignee: Forcast Research & Development Corp. (CA)

( * ) Notice: Subject to any disclaimer, the term of this patent is extended or adjusted under 35 U.S.C. 154(b) by 0 days.

(21) Appl. No.: 15/409,044

(22) Filed: Jan. 18, 2017

(65) Prior Publication Data

US 2017/0129167 A1 May 11, 2017

Related U.S. Application Data

(63) Continuation of application No. PCT/CA2016/050509, filed on May 2, 2016, and a
(Continued)

(51) Int. Cl.
*B29C 67/00* (2017.01)
*B33Y 30/00* (2015.01)
(Continued)

(52) U.S. Cl.
CPC ............ *B33Y 30/00* (2014.12); *B29C 64/129* (2017.08); *B29C 64/20* (2017.08); *B33Y 40/00* (2014.12);
(Continued)

(58) Field of Classification Search
CPC .............. B29C 67/0066; B29C 67/007; B29C 67/0085; B29C 67/0092; B29C 67/0096; B33Y 30/00
See application file for complete search history.

(56) References Cited

U.S. PATENT DOCUMENTS 4,961,154 A * 10/1990 Pomerantz ............ B29C 67/007
264/255
5,122,441 A * 6/1992 Lawton .................. B33Y 10/00
156/58
(Continued)

FOREIGN PATENT DOCUMENTS

CA 2898098 A1 8/2014
CA 2898103 A1 8/2014
(Continued)

OTHER PUBLICATIONS

Broli and Maull, Super Fast 'Membrane Based' 3D, http://www.buildyourownsla.com/forum/viewtopic.php?t=2861 ; Blog entries dated Apr. 5, 2017 and Apr. 7, 2015).*
(Continued)

*Primary Examiner* — Jason L Lazorcik
(74) *Attorney, Agent, or Firm* — Berenato & White, LLC

(57) ABSTRACT

A stereolithography system comprises an emitting device and a tank disposed above the emitting device. The tank has a first optically transparent bottom wall and a second optically transparent bottom wall with a space disposed therebetween. There is a linear stage that extends away from the tank and a carrier platform is moveable along the linear stage away from the tank. There is also a wettable material at a bottom wall of the tank within the tank. A fluid cooling system is in fluid communication the space disposed between the first optically transparent bottom wall of the tank and the second optically transparent bottom wall of the tank.

10 Claims, 33 Drawing Sheets

Related U.S. Application Data continuation-in-part of application No. PCT/CA2016/050299, filed on Mar. 17, 2016, and a continuation-in-part of application No. PCT/CA2015/050860, filed on Sep. 4, 2015.

(60) Provisional application No. 62/275,175, filed on Jan. 5, 2016, provisional application No. 62/155,246, filed on Apr. 30, 2015.

(51) Int. Cl.
| | | |
|---|---|---|
| *B33Y 40/00* | (2015.01) | |
| *B29C 64/129* | (2017.01) | |
| *B29C 64/20* | (2017.01) | |
| *G03F 7/00* | (2006.01) | |
| *B82Y 30/00* | (2011.01) | |
| *B29K 105/00* | (2006.01) | |
| *B33Y 10/00* | (2015.01) | |

(52) U.S. Cl.
CPC .... *G03F 7/0037* (2013.01); *B29K 2105/0058* (2013.01); *B33Y 10/00* (2014.12); *B82Y 30/00* (2013.01)

(56) References Cited

U.S. PATENT DOCUMENTS

| | | | | | |
|---|---|---|---|---|---|
| 5,175,077 | A | * | 12/1992 | Grossa | B29C 67/0092 264/401 |
| 5,192,559 | A | * | 3/1993 | Hull | B29C 67/0062 156/379.6 |
| 5,198,159 | A | * | 3/1993 | Nakamura | B29C 67/0066 156/273.5 |
| 6,027,682 | A | * | 2/2000 | Almquist | B29C 67/0066 264/308 |
| 6,838,035 | B1 | * | 1/2005 | Ederer | B29C 67/0059 264/308 |
| 7,195,472 | B2 | * | 3/2007 | John | B29C 33/68 425/174.4 |
| 7,780,897 | B2 | * | 8/2010 | Wicker | C12M 25/14 264/233 |
| 9,034,237 | B2 | * | 5/2015 | Sperry | B29C 67/0085 264/401 |
| 9,486,964 | B2 | * | 11/2016 | Joyce | B29C 67/0066 |
| 9,499,779 | B2 | * | 11/2016 | Murphy | C12M 29/00 |
| 9,517,128 | B2 | * | 12/2016 | McAlpine | A61L 27/14 |
| 9,636,873 | B2 | * | 5/2017 | Joyce | B29C 67/0096 |
| 2011/0089610 | A1 | * | 4/2011 | El-Siblani | B29C 67/0085 264/401 |
| 2011/0117321 | A1 | * | 5/2011 | Menon | B29C 33/3878 428/156 |
| 2013/0295212 | A1 | * | 11/2013 | Chen | B29C 67/0088 425/150 |
| 2014/0361463 | A1 | * | 12/2014 | DeSimone | B29C 67/0062 264/401 |
| 2014/0363610 | A1 | * | 12/2014 | Sameoto | B81C 99/009 428/92 |
| 2015/0064298 | A1 | | 3/2015 | Syao | |
| 2015/0072293 | A1 | * | 3/2015 | DeSimone | B29C 67/007 430/322 |
| 2016/0136889 | A1 | * | 5/2016 | Rolland | G03F 7/38 264/1.27 |
| 2016/0200052 | A1 | * | 7/2016 | Moore | B29C 67/0092 264/401 |
| 2016/0279895 | A1 | * | 9/2016 | Marjanovic | B32B 3/266 |
| 2016/0368210 | A1 | * | 12/2016 | Chen | B29C 67/0066 |
| 2017/0028618 | A1 | * | 2/2017 | Robeson | B33Y 10/00 |
| 2017/0080641 | A1 | * | 3/2017 | El-Siblani | B29C 67/007 |
| 2017/0100885 | A1 | * | 4/2017 | DeSimone | B29C 67/007 |
| 2017/0113415 | A1 | * | 4/2017 | DeSimone | B29C 67/0088 |
| 2017/0113416 | A1 | * | 4/2017 | DeSimone | B29C 67/0088 |

FOREIGN PATENT DOCUMENTS

| | | |
|---|---|---|
| CA | 2898106 A1 | 8/2014 |
| WO | WO2017056124 A1 | 4/2017 |

OTHER PUBLICATIONS

Broli, "Re: Carbon 3D"; http://www.buildyourownsla.com/forum/viewtopic.php?f=17&t=2788&start=170#p9406 ; Blog entry dated Monday Apr. 6, 2015.*

EdgE's Home (https://web.archive.org/web/20141008221637/http://www.khwelling.nl/3d.dlp_printer.testing.php Archived as of Oct. 8, 2014).*

Wacker (Wacker, "Silicone Gel Solutions" product brochure).*

Ligon (Ligon, S.C., Husar, B., Wutzel, H., Holman, R., and Liska, R., "Strategies to Reduce Oxygen Inhibition in Photoinduced polymerization", Chem. Rev. 2014, 114, 557-589).*

Written Opinion dated Jun. 9, 2016 for corresponding PCT/CA2016/050299.

Written Opinion dated Jan. 11, 2016 for corresponding PCT/CA2016/050860.

Written Opinion for corresponding PCT/CA2016/050509.

International Search Report for PCT/CA2015/050860 dated Nov. 3, 2016.

International Search Report for PCT/CA2016/050299 dated Nov. 3, 2016.

International Search Report for PCT/CA2016/050509 dated Nov. 3, 2016.

* cited by examiner

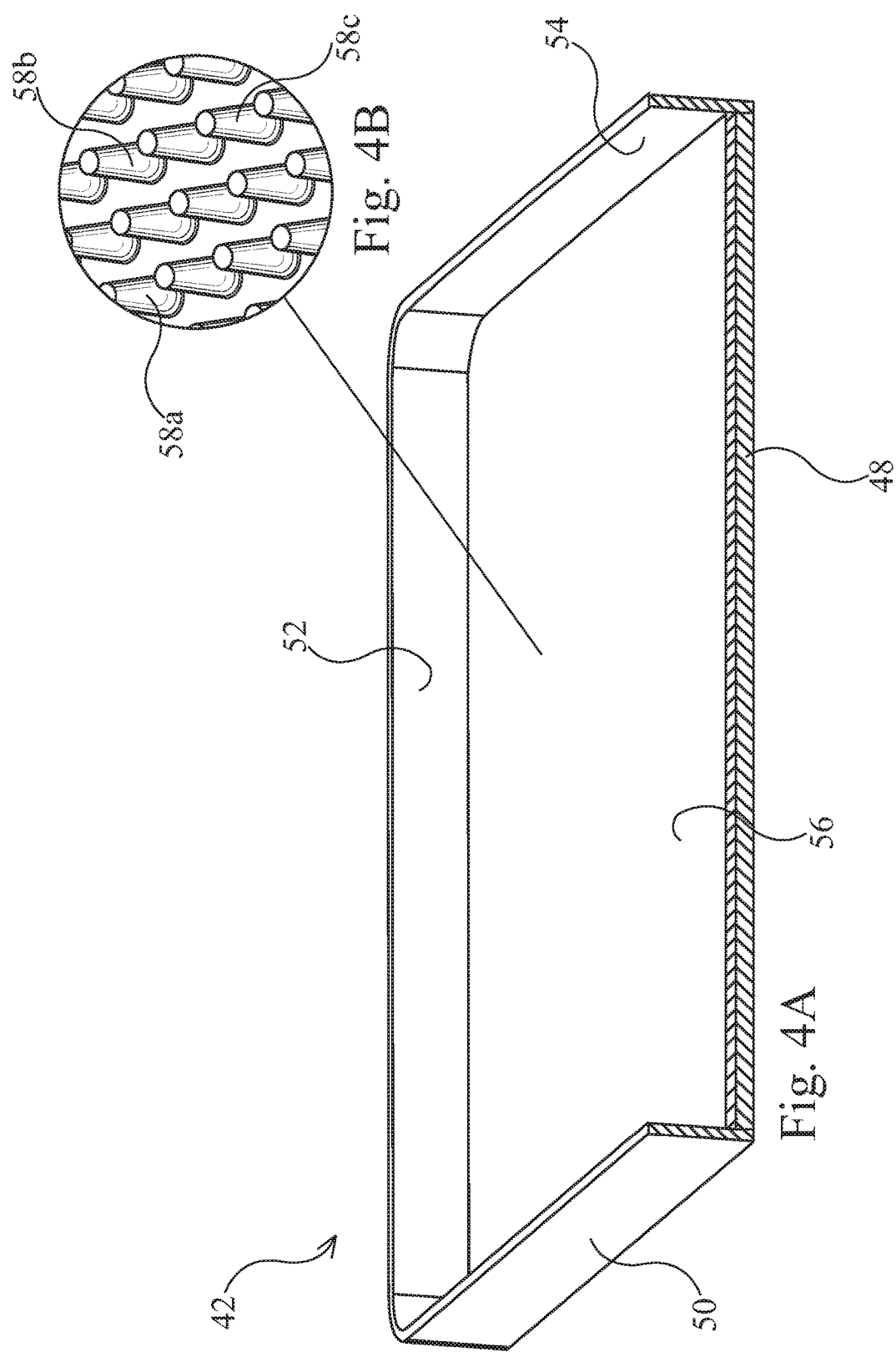

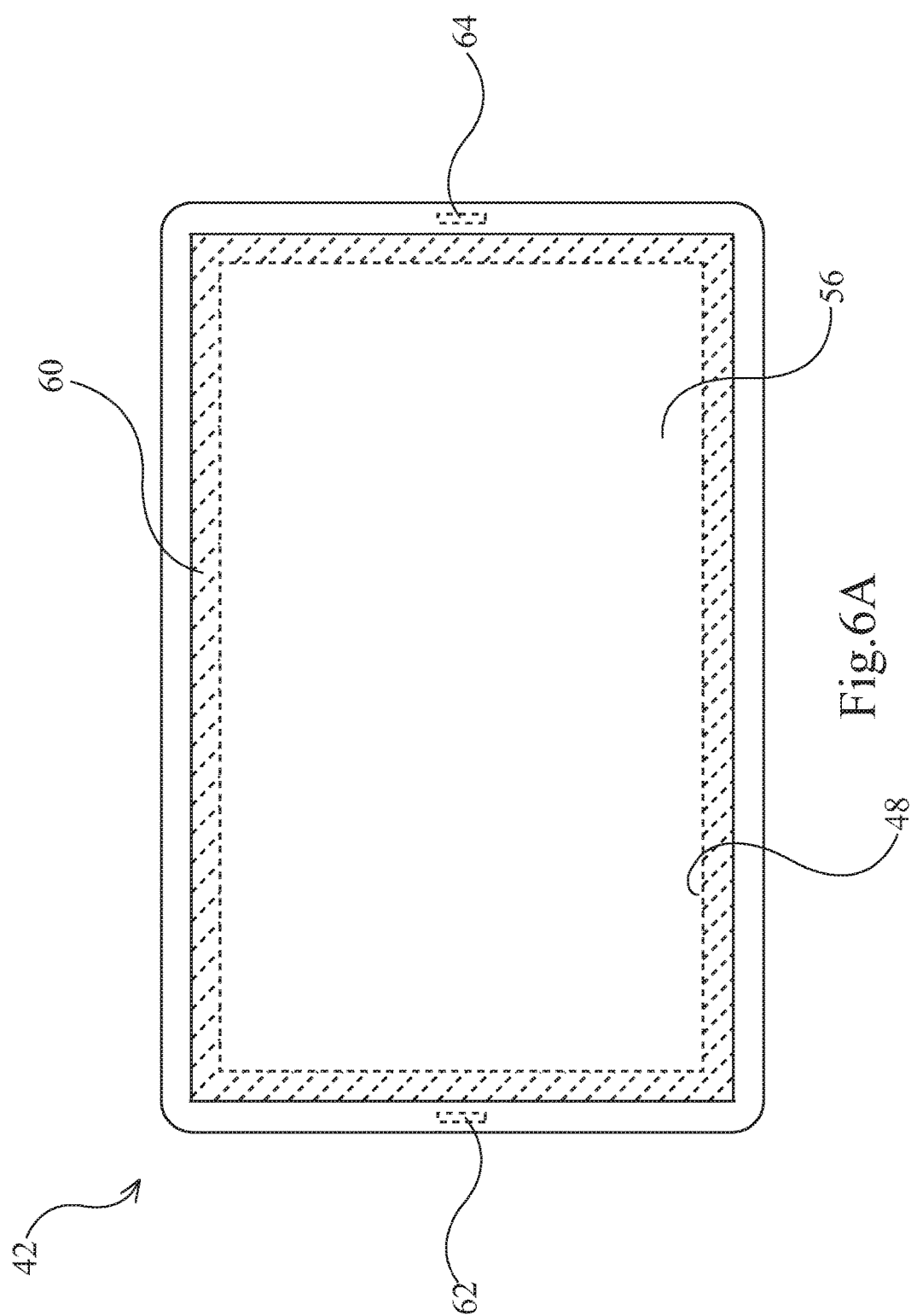

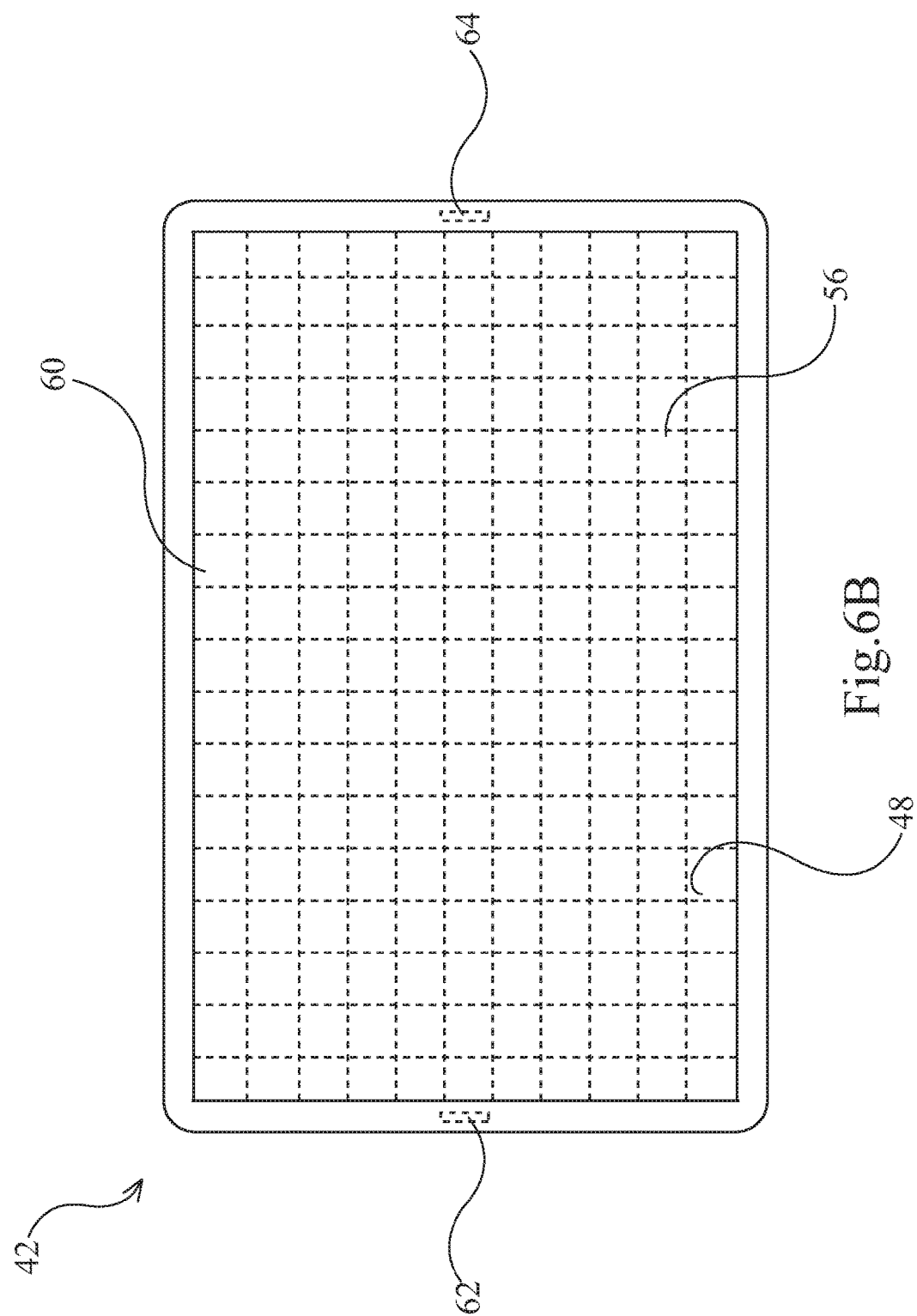

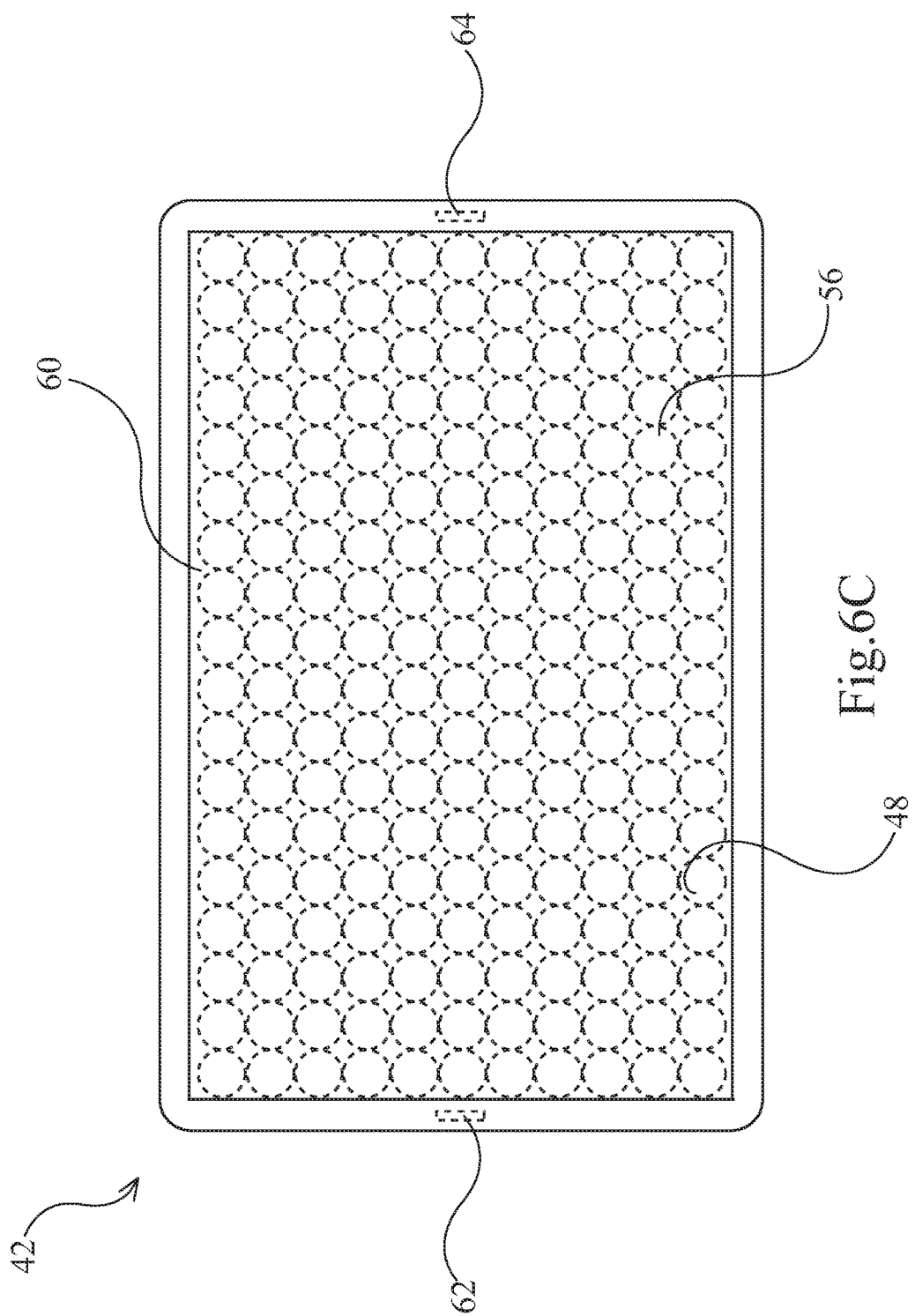

STEREOLITHOGRAPHY SYSTEM

CROSS-REFERENCE TO RELATED APPLICATIONS AND CLAIM TO PRIORITY

This application is a continuation of International Patent Application No. PCT/CA2016/050509 filed May 2, 2016, which claims the benefit of priority of U.S. Provisional Application No. 62/275,175 filed Jan. 5, 2016 and U.S. Provisional Application No. 62/155,246 filed Apr. 30, 2015, the complete disclosures of which are incorporated herein by reference. This application is also a continuation-in-part of International Application No. PCT/CA2016/050299 filed Mar. 17, 2016, which claims the benefit of priority of the U.S. Provisional Application Nos. 62/275,175 and 62/155, 246, and is a continuation-in-part application of International Application No. PCT/CA2015/050860 filed Sep. 4, 2015, which claims the benefit of priority of the U.S. Provisional Application No. 62/155,246, the complete disclosures of which are incorporated herein by reference.

BACKGROUND OF THE INVENTION

Field of the Invention

The present invention relates to a stereolithography system and, in particular, to a stereolithography system including a tank with a wettable material at an optically transparent bottom thereof.

Description of the Related Art

PCT Application Publication Number WO 2014/126837 to DiSimone et al., the full disclosure of which is incorporated herein by reference, discloses a method of forming a three-dimensional object. The method comprises providing a carrier and an optically transparent member having a build surface. The carrier and the build surface define a build region therebetween. The build region is filled with a polymerizable liquid and the build region is irradiated through the optically transparent member to form a solid polymer from the polymerizable liquid while concurrently advancing the carrier away from the build surface to form the three-dimensional object from the solid polymer, while also concurrently: (i) continuously maintaining a dead zone of polymerizable liquid in contact with the build surface, and (ii) continuously maintaining a gradient of polymerization zone between the dead zone and the solid polymer and in contact with each thereof, the gradient of polymerization zone comprising the polymerizable liquid in partially cured form. An apparatus for carrying out the method is also disclosed.

SUMMARY OF THE INVENTION

It is an object of the present invention to provide an improved stereolithography system.

There is accordingly provided a stereolithography system comprising an emitting device and a tank disposed above the emitting device. The tank has a first optically transparent bottom wall and a second optically transparent bottom wall with a space disposed therebetween. There is a linear stage which extends away from the tank and a carrier platform which is moveable along the linear stage away from the tank. There is also a wettable material at the first optically transparent bottom wall of the tank within the tank. A fluid cooling system is in fluid communication the space disposed between the first optically transparent bottom wall of the tank and the second optically transparent bottom wall of the tank.

The wettable material may be coated on the first optically transparent bottom wall of the tank or the wettable material may be a membrane that overlays the first optically transparent bottom wall of the tank. The first optically transparent bottom wall of the tank may have a thermal conductivity of greater than 20 W/(m×K) at 300K. The first optically transparent bottom wall of the tank may be sapphire glass or transparent ceramic spinel.

The wettable material may include a hydrogel and, in certain examples, may include a hydrogel and hydrogen peroxide. The wettable material may include a hydrogen donor and an oxygen scavenger. The wettable material may include glycerin. The wettable material may include a UV inhibitor. The wettable material may have a superhydrophobic surface. A nanostructure of the superhydrophobic surface of the wettable material may be a vertically aligned surface or a hierarchically structured surface, or a combination thereof. A nanostructure of the superhydrophobic surface of the wettable material may include a plurality of projections which have a top diameter of between 5 microns and 15 microns and which are spaced less than 10 microns apart. The wettable material may be adhered to the bottom of the tank using adhesive applied in a pattern having intersecting lines.

The fluid cooling system may pump air into the space disposed between the first optically transparent bottom wall of the tank and the second optically transparent bottom wall of the tank. The fluid cooling system may pump water into the space disposed between the first optically transparent bottom wall of the tank and the second optically transparent bottom wall of the tank. There may be a cooling device which cools the tank and the cooling device may be an air knife. The second optically transparent bottom wall of the tank may include a UV OLED or an LCD monitor with a UV LED. The tank may further include a reservoir in fluid communication with the wettable material. In other examples, the optically transparent bottom wall of the tank and the emitting device may be integral. There may be a vibrator that vibrates the tank. The vibrator may vibrate at between 25 HZ and 60 HZ. The vibrator may be a piezo vibrator.

There is also provided a stereolithography system comprising an emitting device and a tank disposed above the emitting device. The tank has a first optically transparent bottom wall and a second optically transparent bottom wall with a space disposed therebetween. There is a linear stage which extends away from the tank and a carrier platform which is moveable along the linear stage away from the tank. There is also a silicone material at the first optically transparent bottom wall of the tank within the tank. A fluid cooling system is in fluid communication the space disposed between the first optically transparent bottom wall of the tank and the second optically transparent bottom wall of the tank. The silicone material may have a superhydrophobic surface. A nanostructure of the superhydrophobic surface of the silicone material may be a vertically aligned surface or a hierarchically structured surface, or a combination thereof. A nanostructure of the superhydrophobic surface of the silicone material may include a plurality of projections which have a top diameter of between 5 microns and 15 microns and which are spaced less than 10 microns apart. The silicone material may be adhered to the bottom of the tank using adhesive applied in a pattern having intersecting lines. There may be a vibrator that vibrates the tank. The vibrator may vibrate at between 25 HZ and 60 HZ. The vibrator may be a piezo vibrator.

BRIEF DESCRIPTIONS OF DRAWINGS

The invention will be more readily understood from the following description of the embodiments thereof given, by way of example only, with reference to the accompanying drawings, in which:

FIG. 4A is a perspective, sectional view of a tank of the stereolithography system of FIG. 1;

FIG. 4B is an enlarged view of a surface area of a wettable material within the tank of the stereolithography system of FIG. 1;

FIGS. 6A to 6C are top, plan views of the tank of the sterolithography system of FIG. 1;

DESCRIPTIONS OF THE PREFERRED EMBODIMENTS

Figure 1:
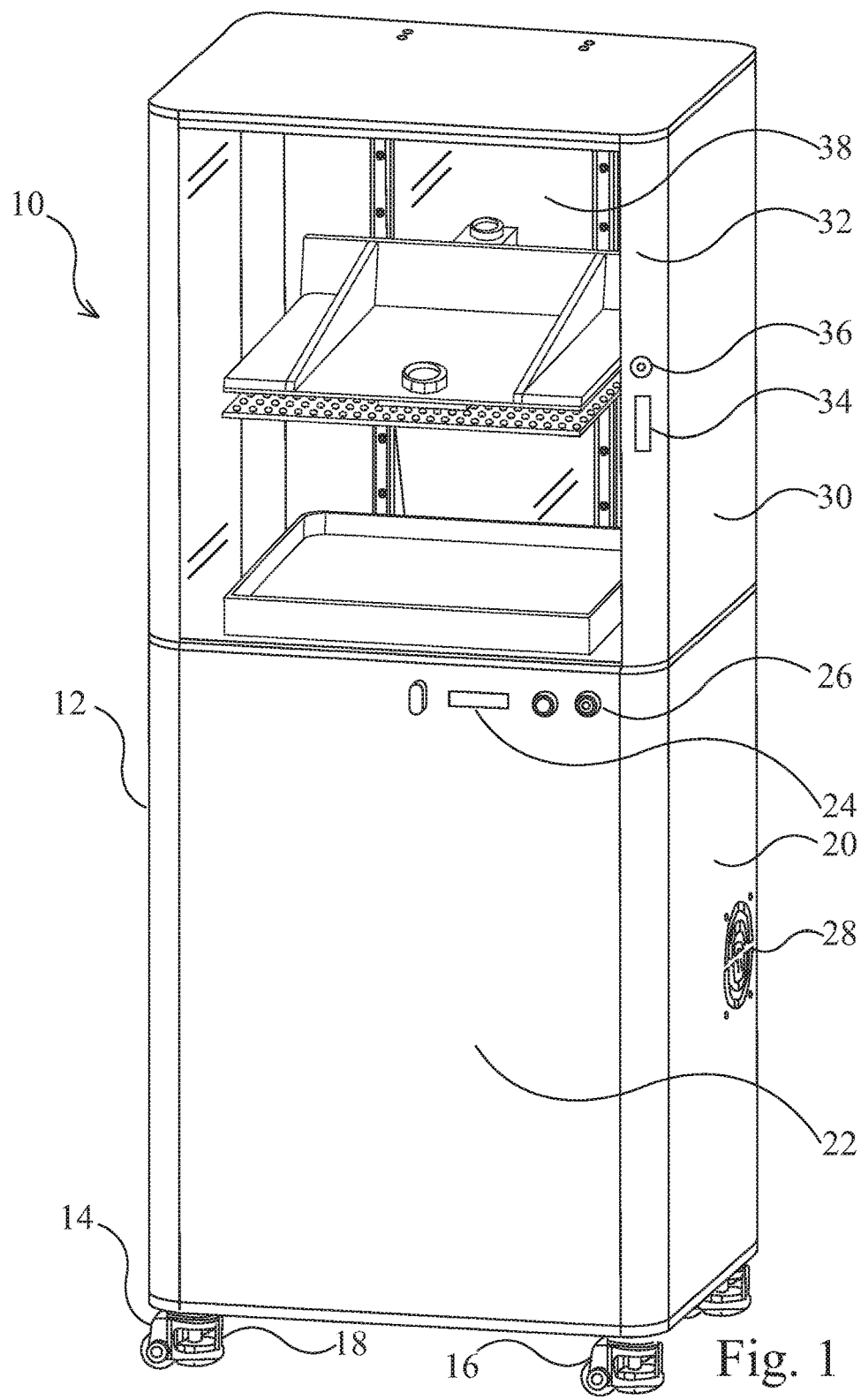
FIG. 1 is a perspective view of an improved stereolithography system.
Figure 2:
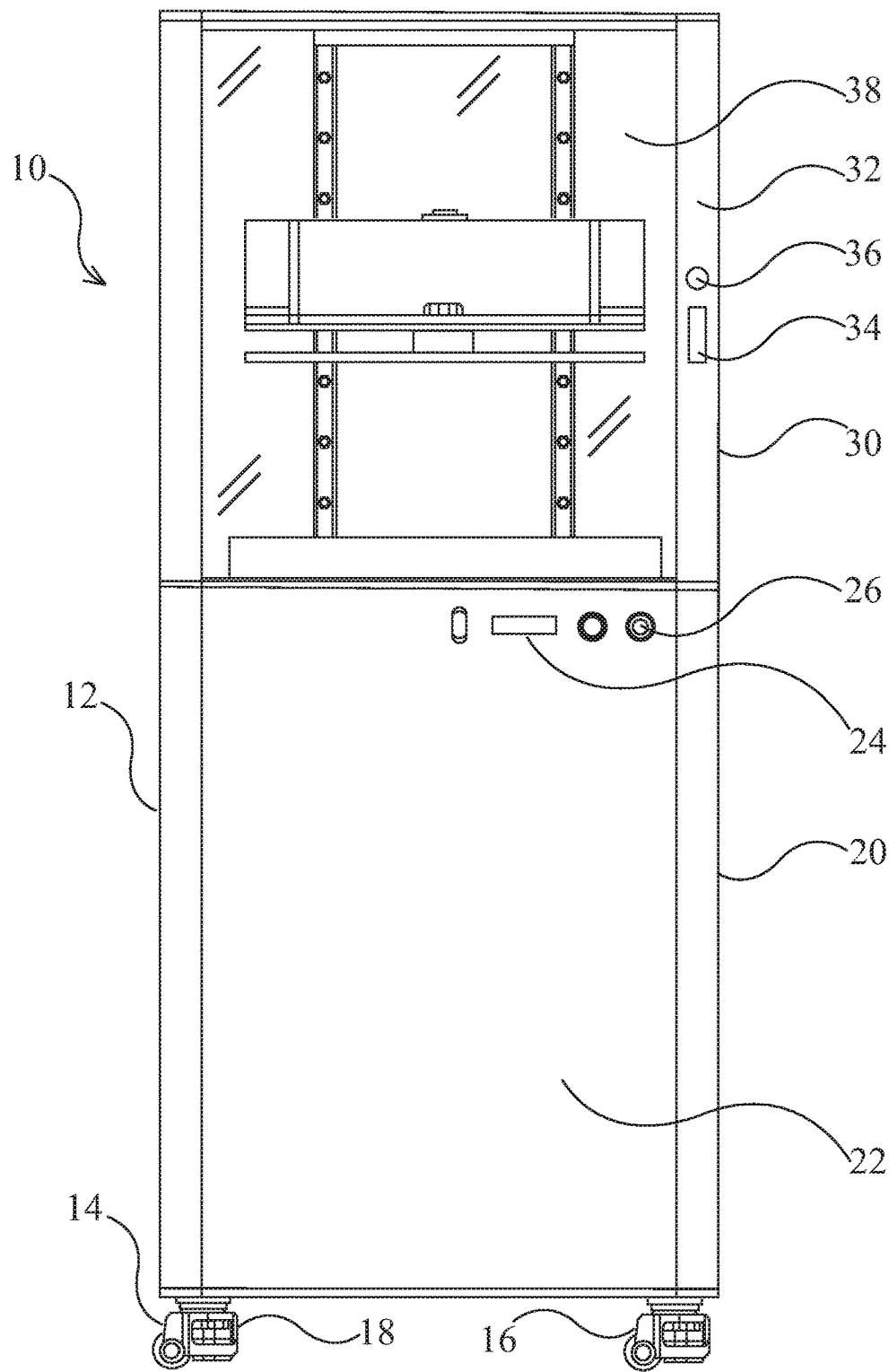
FIG. 2 is a front elevation view of the stereolithography system of FIG. 1.

Referring to the drawings and first to FIGS. 1 and 2, an improved stereolithography system 10 is shown. The stereolithography system 10 comprises a housing 12 which is mounted on a plurality of castors, for example castors 14 and 16, to allow the stereolithography system 10 to be easily moved to a desired location. The castors 14 and 16 are substantially identical in structure and function and each have a respective brake, for example, brake 18 which is called out for one of the castors 14. The brake 18 is a ground engaging brake and allows the stereolithography system 10 to be fixed at the desired location. The housing 12 has a lower portion 20 and an upper portion 30. The lower portion 20 of the housing 12 includes a door 22 provided with a handle 24 and a lock 26 to allow and restrict access to the lower portion 20 of the housing 12. The lower portion 20 of the housing 12 is also provided with a vent 28, shown only in FIG. 1, to allow air to circulate in the lower portion 20 of the housing 12. Likewise, the upper portion 30 of the housing 12 includes a door 32 provided with a handle 34 and a lock 36 to allow and restrict access to the upper portion 30 of the housing 12. In this example, the door 32 of the upper portion 30 of the housing 12 is provided with an optically transparent pane 38.

Figure 3:
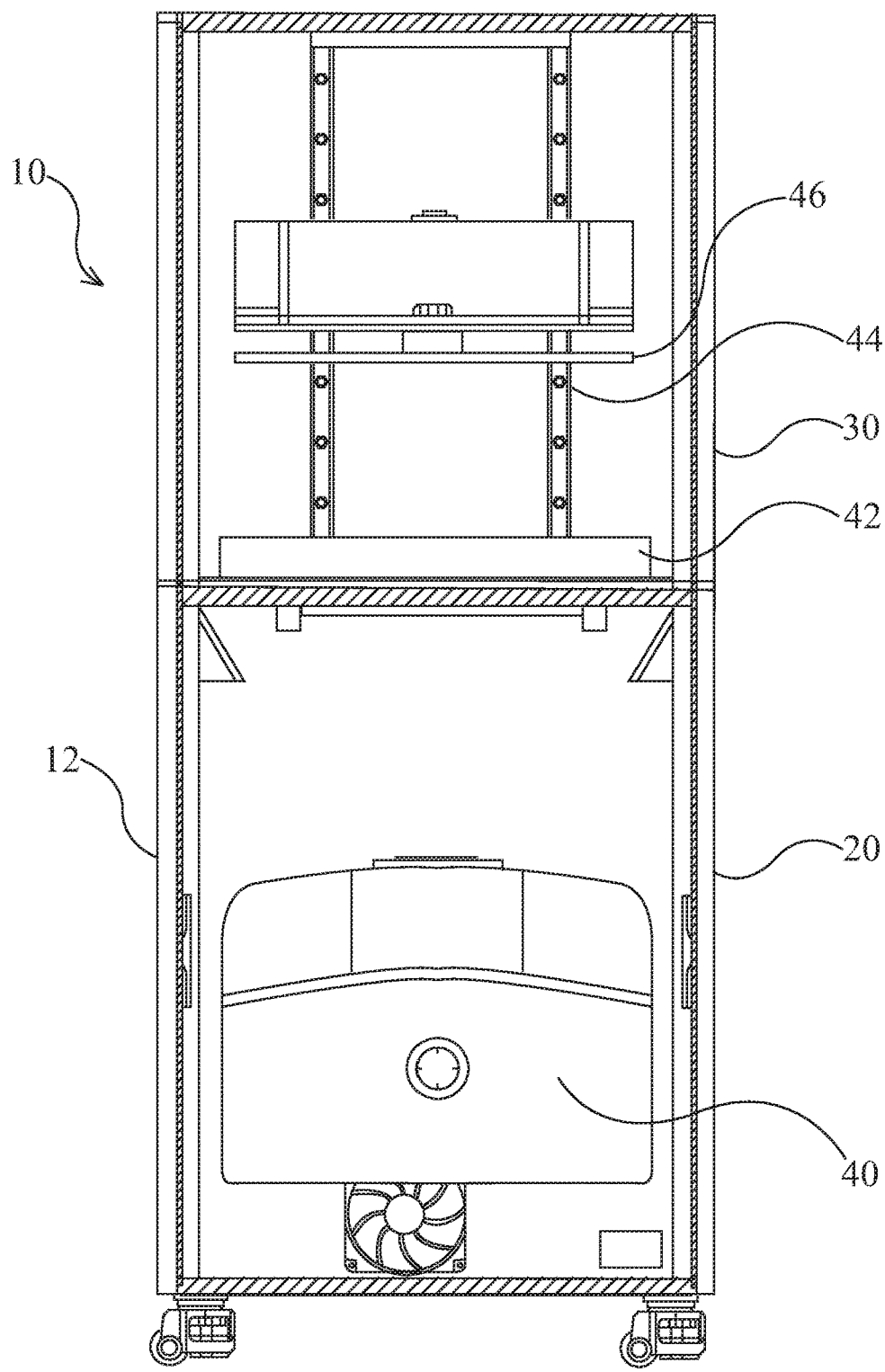
FIG. 3 is a front elevation, partially broken away view of the stereolithography system of FIG. 1.

Referring now to FIG. 3, there is an emitting device 40 disposed within the lower portion 20 of the housing 12. The emitting device may be any suitable light-emitting device which may be used to cure or polymerize resin. There is a tank 42 disposed within the upper portion 30 of the housing 12 above the emitting device. There is also a linear stage 44 in the upper portion 30 of the housing 12. The linear stage 44 extends vertically away from the tank 42 and a carrier platform 46 is moveable along the linear stage 44. The stereolithography system 10, as thus far described, is a generally conventional stereolithography system used in a "top down" three-dimensional printing technique in which cross-sections of an object are formed at a bottom of the object being formed.

However, as best shown in FIG. 4A, the tank 42 of the stereolithography system 10 has a novel structure. The tank 42 has a bottom wall 48 which is optically transparent. There is a plurality of side walls, for example, side walls 50, 52 and 54 which extend from the bottom wall 48 of the tank 42. There is an optically transparent wettable material 56 at the bottom wall 48 of the tank 42 within the tank 42. The wettable material 56 may be any material that is capable of being wetted, i.e. retaining water. In this example, the wettable material 56 is in the form of a membrane and overlays the bottom wall 48 of the tank 42. However, in other examples, the wettable material 56 may be coated or formed on the bottom wall 48 of the tank 42. The wettable material 56 may have a thickness of between 1 millimeter and 4 millimeters.

Figure 5A:
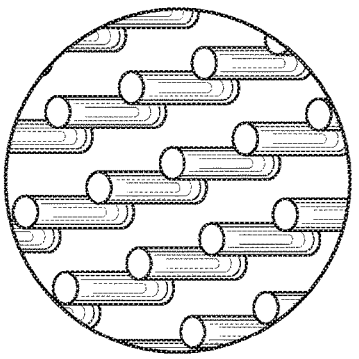
FIGS. 5A to 5D are enlarged views of alternative embodiments of a surface area of a wettable material that may be within the tank of the stereolithography system of FIG. 1.
Figure 5B:
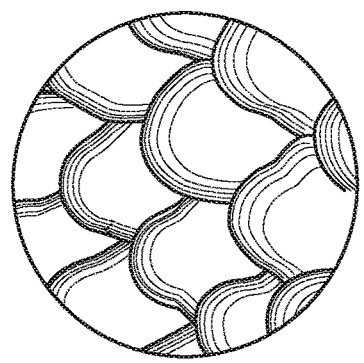
Figure 5C:
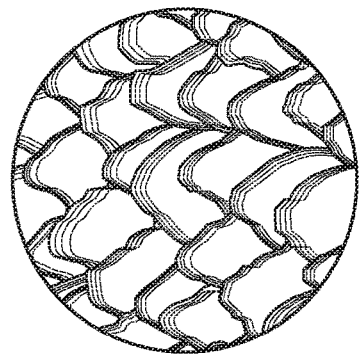
Figure 5D:
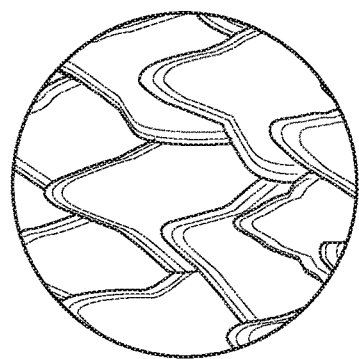

FIG. 4B shows the nanostructure of a surface of the wettable material 56. The nanostructure of the surface of the wettable material 56 includes a plurality of projections in the form of truncated cones, for example projections 58a, 58b and 58c, which are spaced-apart along the surface of the wettable material 56. In this example, the projections 58a, 58b and 58c have a base diameter of between 10 microns and 20 microns and a top diameter of between 5 microns and 15 microns. The projections 58a, 58b and 58c are spaced-apart at less than 10 microns apart in this example. The nanostructure of the surface of the wettable material 56 renders the surface of the wettable material 56 a superhydrophobic surface and may take alternative suitable forms as shown in FIGS. 5A to 5D which are illustrative examples. In FIG. 5B the nanostructure of the surface of the wettable material comprises a plurality of projections in the form of cylinders. In FIGS. 5C and 5D the nanostructure of the surface of the wettable material are replicas a nanostructure of a flower petal. The nanostructure of the surface of the wettable material 56 may be prepared by chemical treatment or laser sculpting or photolithography. The nanostructure of the surface of the wettable material 56 may be a vertically aligned surface, or a hierarchically structured surface, or a combination thereof. It may still alternatively be possible to coat the nanostructure of the surface of the wettable material 56 with, for example, Teflon® or another hydrophobic material. It will be understood by a person skilled in the art that the same or a similar process as described in this paragraph may be used to provide a silicone material (e.g. layer) in a conventional "top-down" stereolithography system with a superhydrophobic surface.

Referring now to FIGS. 6A to 6C, in this example, the wettable material 56 is secured to the bottom wall 48 (not shown in FIGS. 6A to 6C) of the tank 42 by an optically transparent adhesive 60 such as an adhesive primer or a cyanoacrylate adhesive. The wettable material 56 may be adhered to the bottom wall 48 of the tank 42 about its perimeter only as shown in FIG. 6A. This allows the wettable material 56 to flex. The wettable material 56 may be adhered to the bottom wall 48 of the tank 42 in a grid pattern as shown in FIG. 6B. This allows the wettable material 65 to flex only within defined areas. A similar result may be achieved by adhering the wettable material 56 in circular patterns as shown in FIG. 6C or any other suitable pattern with intersecting lines. It will be understood by a person skilled in the art that the same or a similar process as described in this paragraph may be used to adhere a silicone material (e.g. layer) to a conventional "top-down" stereolithography system to allow the silicone material to flex only within defined areas.

The tank 42 is also provided with actuators which may be in the form of vibrators 62 and 64. In this example, the vibrators 62 and 64 are ultrasonic transducers and, in particular, piezo actuators or vibrators. However, any suitable vibrator may be used. The vibrators 62 and 64 are used in the vertical orientation in this example but may be used in the horizontal orientation in other examples. The vibrators 62 and 64 may vibrate at frequencies between 25 Hz and 60 Hz. The vibrators 62 and 64 function to tilt the tank 42 when required. However, any suitable actuators such as motor driven linear actuators disposed on either side of the tank may be used to tilt the tank in other examples.

Figure 7:
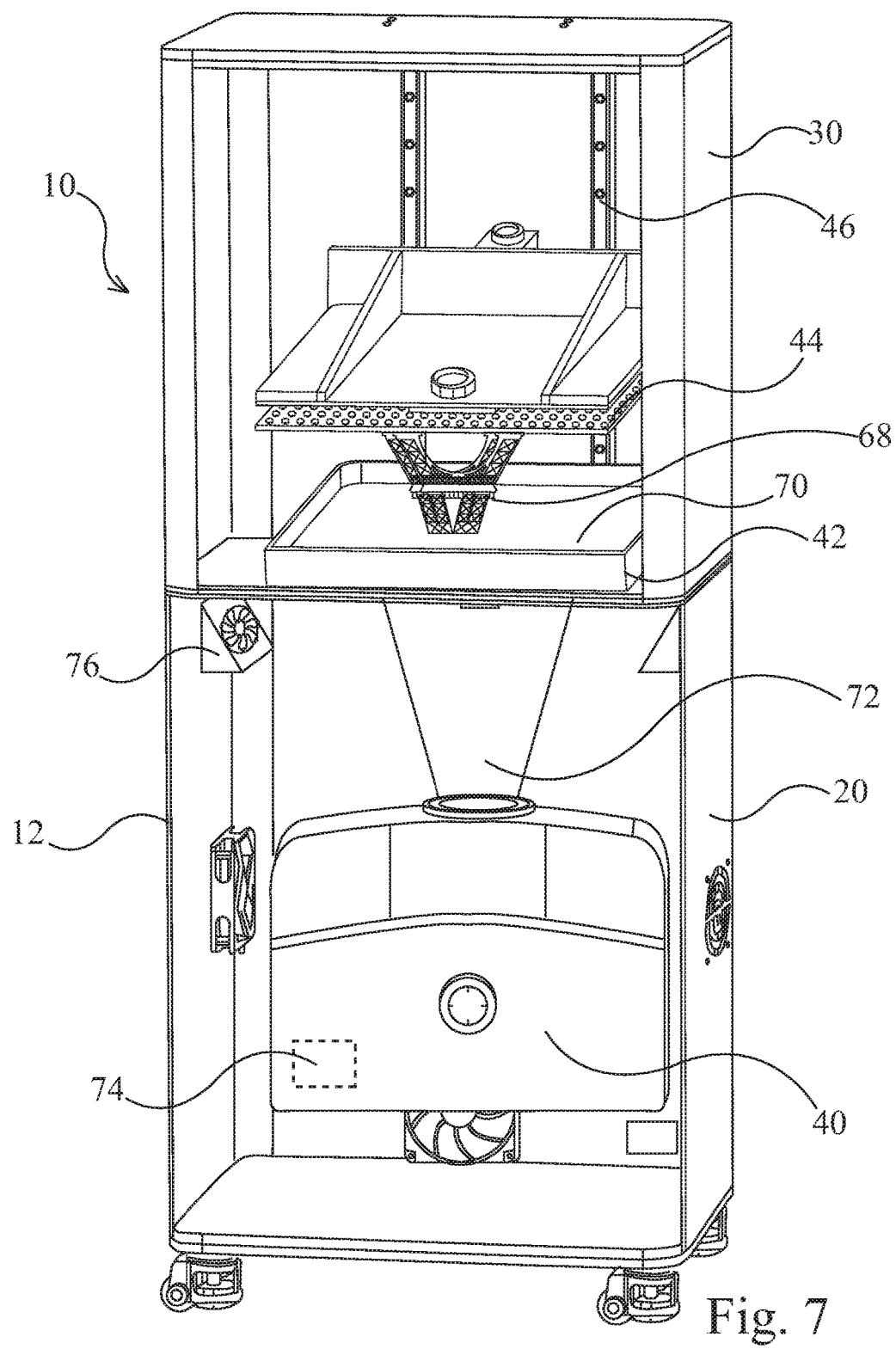
FIG. 7 is a perspective, partially broken away view of the stereolithography system of FIG. 1 showing an object being formed.

FIG. 7 shows an object 68 being formed from resin 70 in the tank 42 of the stereolithography system 10. The emitting device 40 emits a blast or emission of light 72 as the object 68 is being formed on the carrier platform 46. The carrier platform 46 moves upwardly away from the tank 42 as the emitting device 40 emits the blast or emission of light 72 and the object 68 is formed. A controller 74 may be used to control the duration and the intensity of the blast or emission of light depending on the object being formed or part of the object being formed. The object 68 may accordingly be formed using continuous, continuous-layered, or layered curing of the resin 70 in the tank 42. The stereolithography system 10 may also be provided with a cooling device such as a cooling fan 76 to cool the tank 42, and contents thereof, namely, the wettable material 56 and the resin 70 when the object 68 is being formed and high temperatures are generated. The cooling device may alternatively be an air knife or another suitable cooling device. High temperatures are generated during the operation of the stereolithography system 10 disclosed herein because of the relatively high speeds at which the object 68 is formed. It will be understood by a person skilled in the art that the resin is cured or polymerized by irradiation to form cross-sections of the object 68.

Since heat is created as the resin cures, it is desirable to dissipate as much heat as possible, in particular, when the object 68 is being formed continuously. By forming the bottom wall 48 of the tank 42 from a material with high thermal conductivity, the heat can be dissipated more quickly which allows the size of the cross-section and the height of the object 68 to be increased as a result of less heat being accumulated. Furthermore, if the bottom wall 48 of the tank 42 has a high thermal conductivity, then air bubbles are generally not formed in the wettable material and/or resin. The formation of air bubbles in the wettable material and/or resin may adversely affect the formation of the object 68.

It is accordingly desirable to form the bottom wall 48 of the tank 42 from an optically transparent material with high thermal conductivity. Sapphire glass, which has a thermal conductivity of 25 W/(m×K) at 300K, may be used to form the bottom wall 48 of the tank 42. Transparent ceramic spinel, which has a thermal conductivity of 25 W/(m×K) at 300K, may also be used to form the bottom wall 48 of the tank 42. Low-iron glasses with high thermal conductivity such as Starphire™ glass may also be used However, the bottom wall 48 of the tank 42 may also be formed from acrylic glass, which has a thermal conductivity of 0.20 W/(m×K) at 25K, or soda-lime glass or soda-lime-silica glass which has a thermal conductivity of 0.95 W/(m×K) at 25K.

Figure 8:
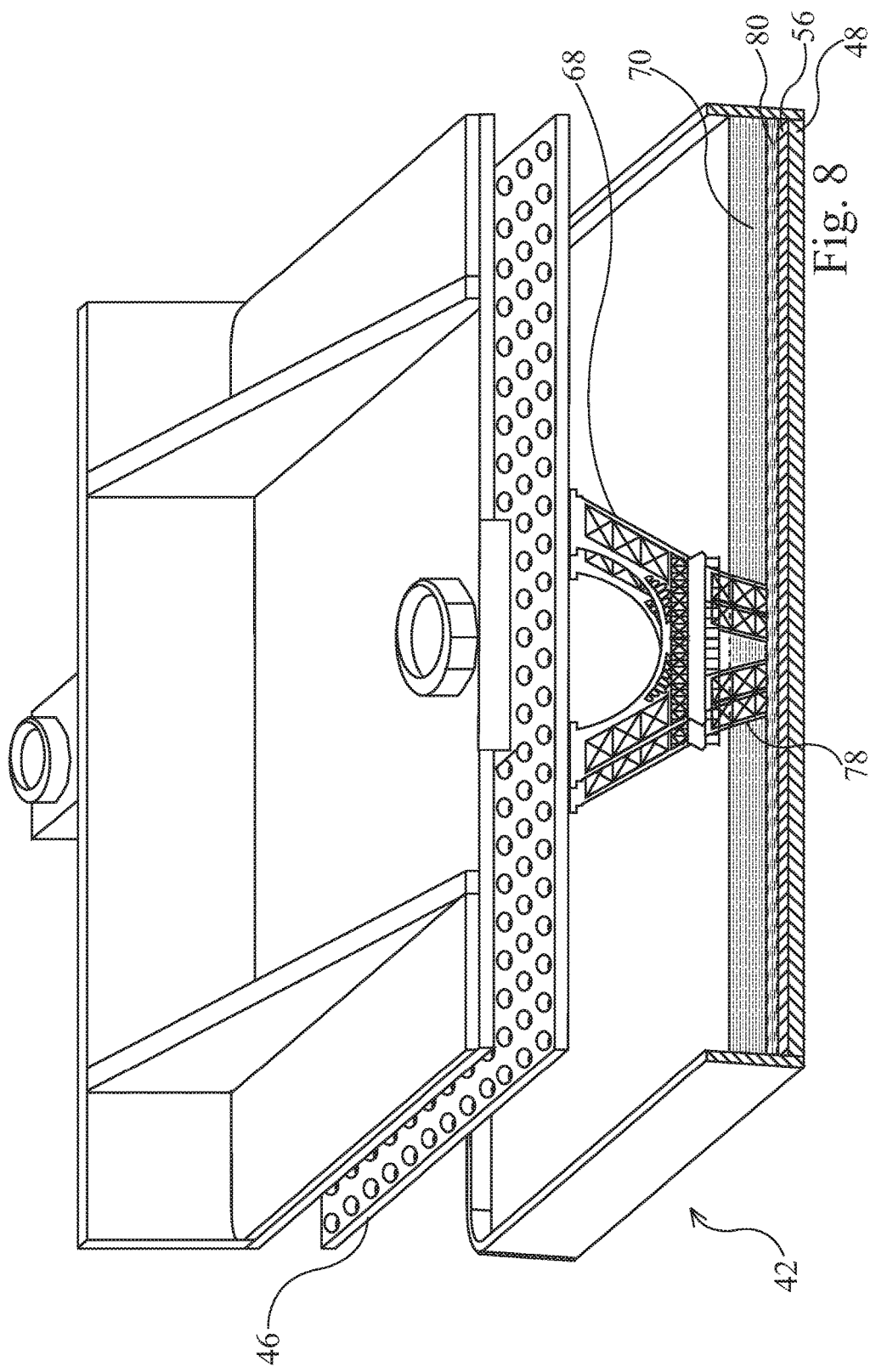
FIG. 8 is a fragmentary view of the stereolithography system of FIG. 1 showing a hollow portion of the object being formed by continuous curing of the resin.
Figure 9:
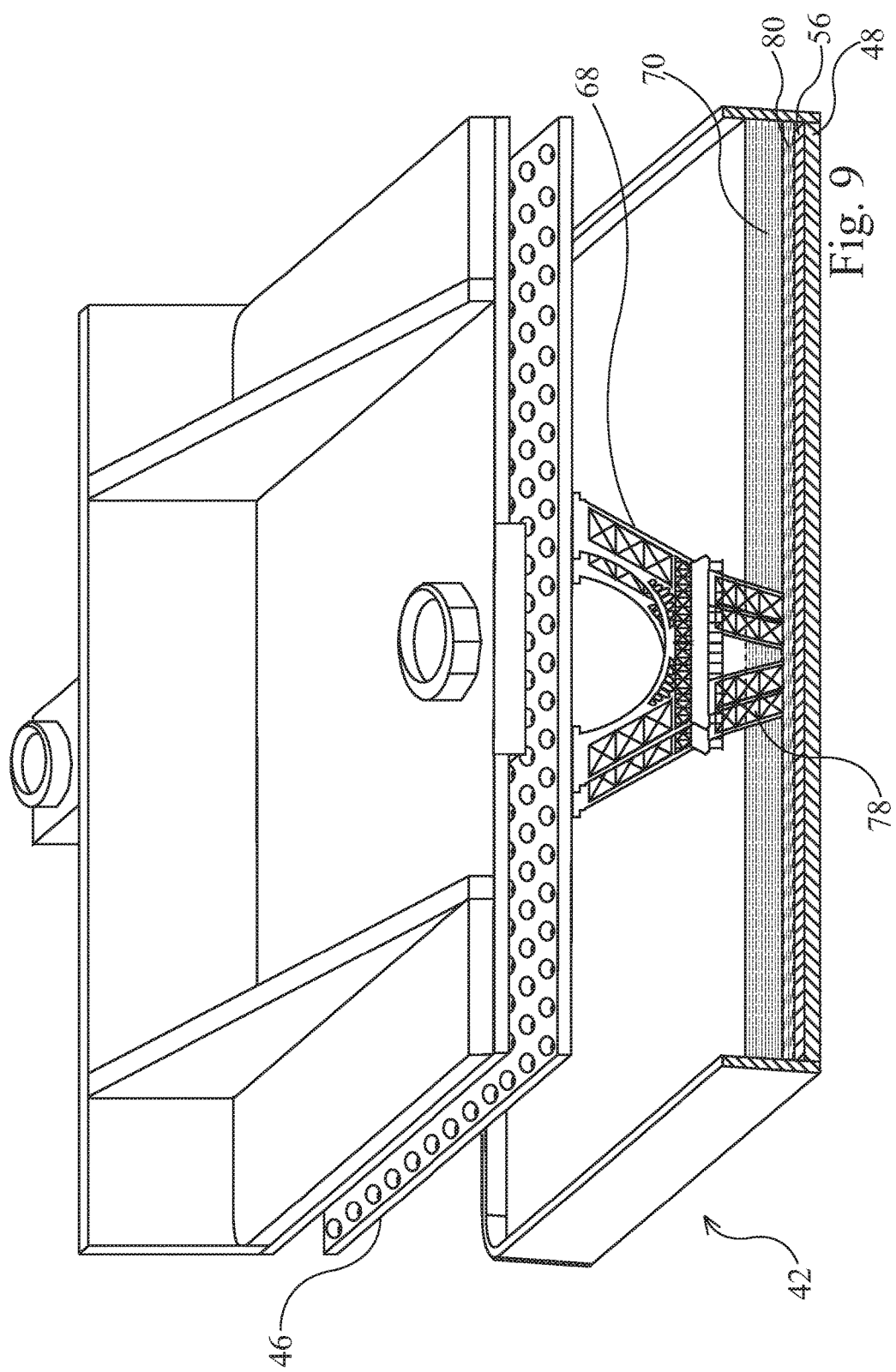
FIG. 9 is another fragmentary view of the stereolithography system of FIG. 1 showing the hollow portion of the object being formed by continuous curing of the resin.

During the formation of a hollow portion 78 of the object 68, as shown in FIGS. 8 and 9, the controller 74 may decrease the duration of the blast or emission of light 72 and increase the intensity of the blast or emission of light 72. The duration of the blast or emission of light 72 is decreased during the formation of the hollow portion 78 because less time is required for the resin to cure or polymerize due to the smaller surface area being cured. However, the intensity of the blast or emission of light 72 is increased during the formation of the hollow portion 78 to accelerate the formation of the object 68 though continuous formation of cross-sections of the object 68. FIGS. 8 and 9 show a gap 80 between the wettable material 56 at the bottom wall 48 of the tank 42 and the object 68 being formed from the resin 70 in the tank 42. The gap 80 allows the object 68 to be formed continuously because the object 68 is not formed directly on the bottom wall 48 of the tank 42 thereby generally doing away with the need for the object 68 to be peeled or pulled away from the bottom wall 48 of the tank 42 during the formation of the hollow portion 78 of the object 68.

Figure 10:
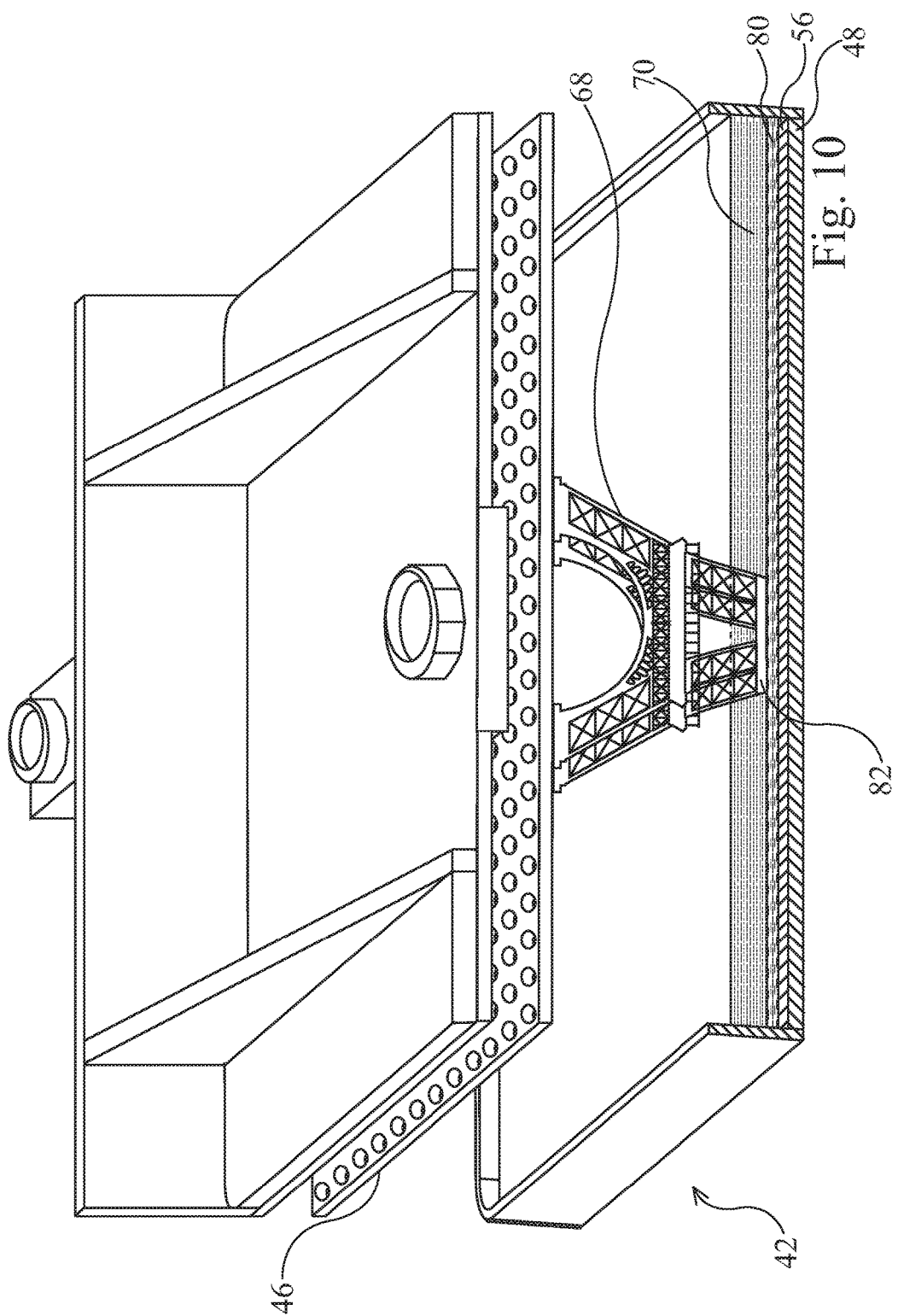
FIG. 10 is a fragmentary view of the stereolithography system of FIG. 1 showing a solid portion of the object with a relatively small cross-section being formed by continuous-layered curing of the resin.
Figure 11:
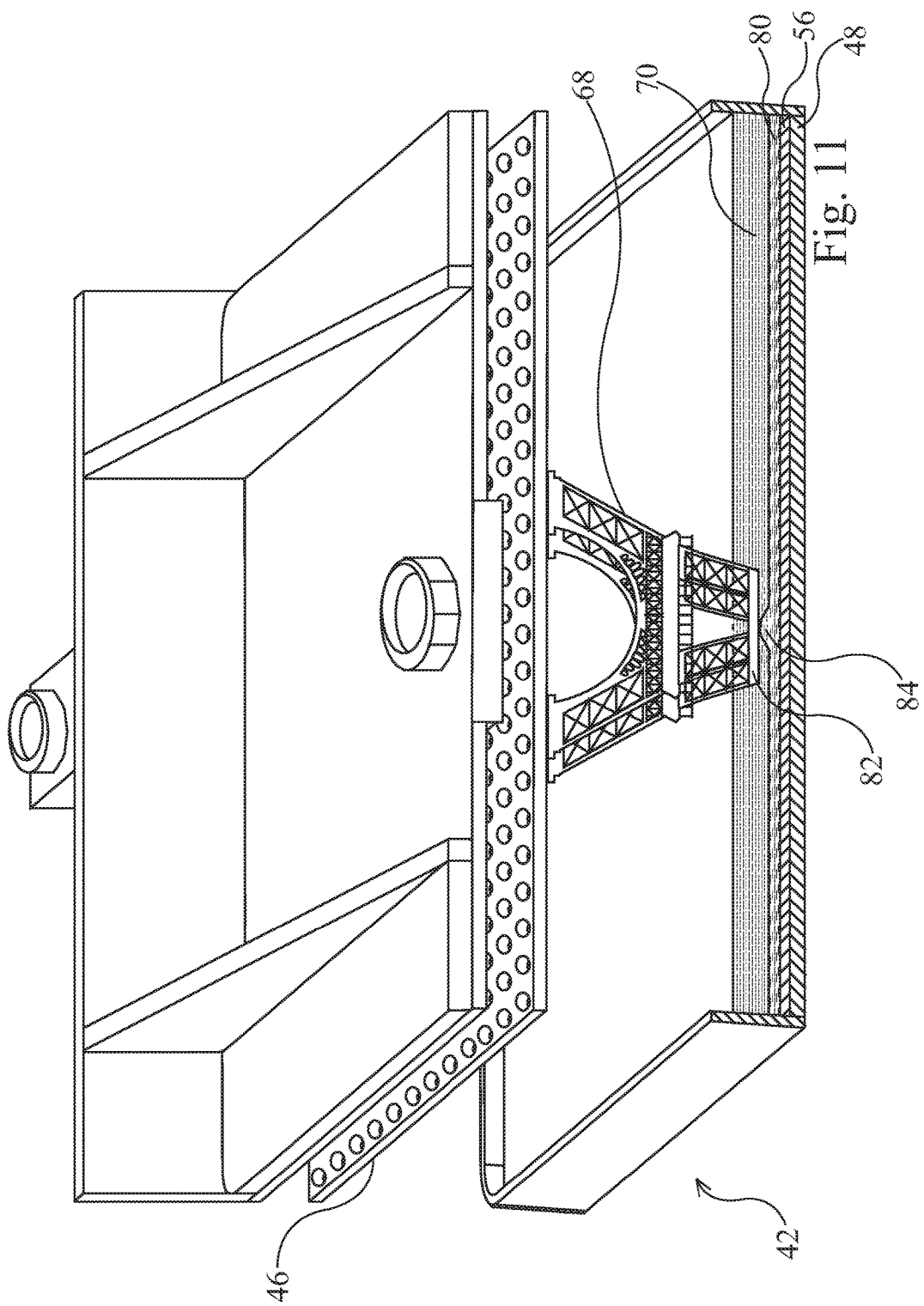
FIG. 11 is a fragmentary view of the stereolithography system of FIG. 1 showing a solid portion of the object with a relatively small cross-section being formed by continuous-layered curing of the resin with the wettable material flexing as the object is being pulled away from a bottom of a tank.
Figure 12:
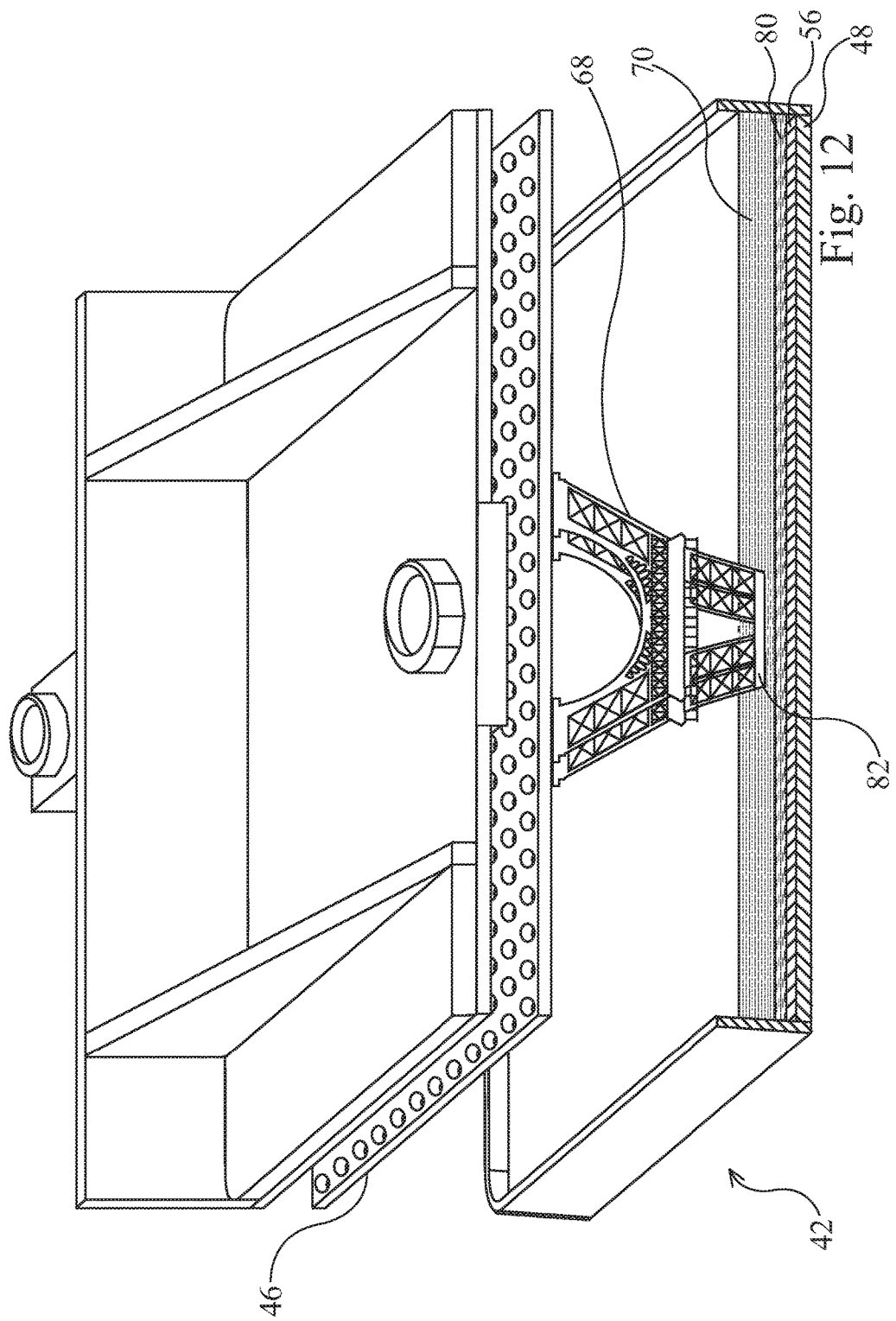
FIG. 12 is a fragmentary view of the stereolithography system of FIG. 1 showing the solid portion of the object with a relatively small cross-section being formed by continuous-layered curing of the resin.
Figure 13:
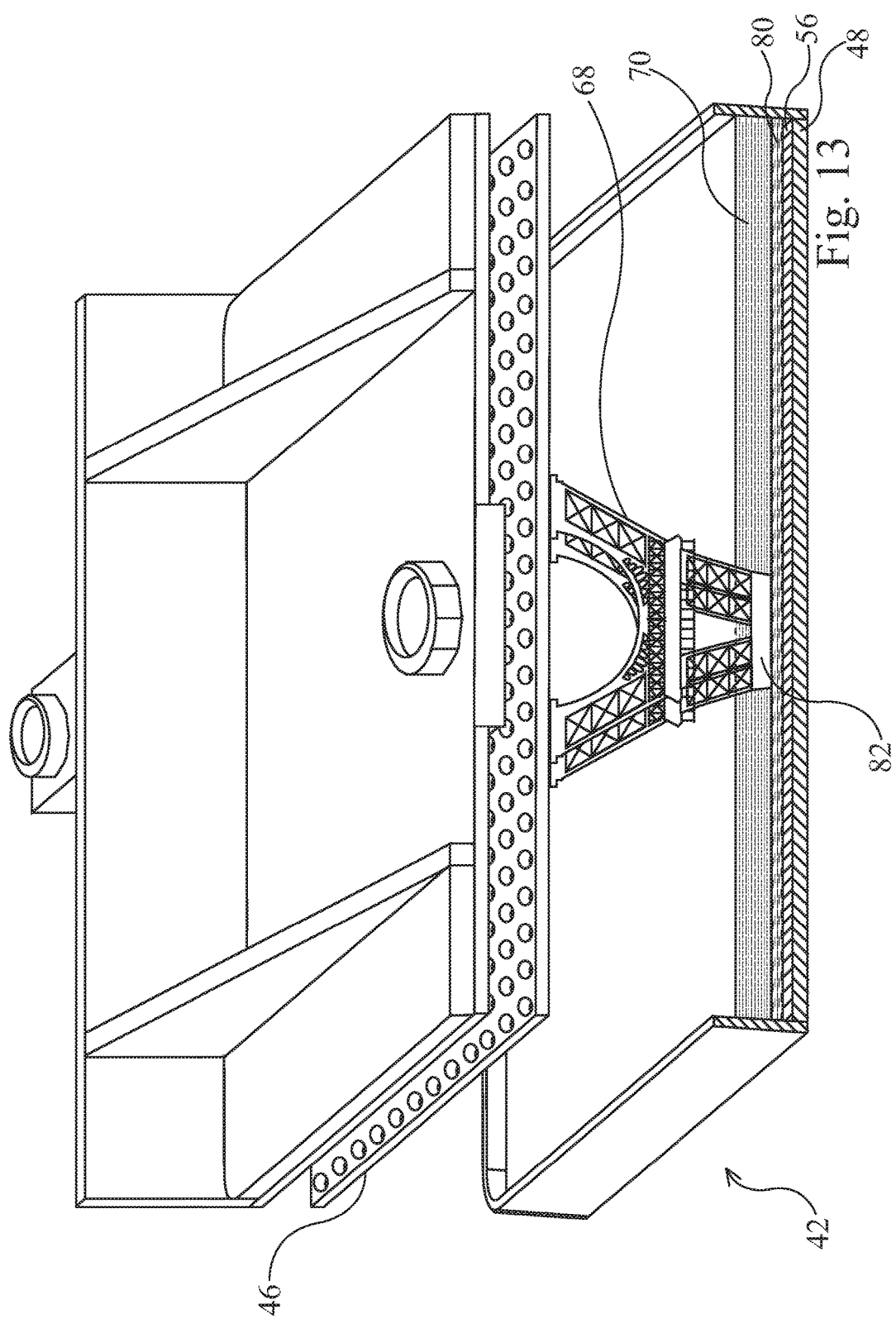
FIG. 13 is another fragmentary view of the stereolithography system of FIG. 1 showing the solid portion of the object with a relatively small cross-section being formed by continuous-layered curing of the resin.

During the formation of a solid portion 82 of the object 68 with a relatively small cross-section, as shown in FIGS. 10 to 13, the controller 74 may increase the duration of the blast or emission of light 72 and lower the intensity of the blast or emission of light 72 during the formation of the solid portion 82. The duration of the blast or emission of light 72 is increased during the formation of the solid portion 82 because additional time is required for the resin to cure or polymerize due to the larger surface area being cured. The intensity of the blast or emission of light 72 is lowered during the formation of the solid portion 82 to minimize excess heat which may dry the wettable material 56. FIGS. 10 and 13 also show a gap 80 between the wettable material 56 at the bottom wall 48 of the tank 42 and the object 68 being formed from the resin 70 in the tank 42. The gap 80 allows the object 68 to be formed by continuous-layered curing of the resin 70 because the object 68 is not formed directly on the bottom wall 48 of the tank 42 and the object 68 can be easily pulled away from the bottom wall 48 of the tank 42, as best shown in FIGS. 10 and 11, during the formation of at the solid portion 82 of the object 68. This is because the wettable material 56 is able to flex within defined areas, as shown at area 84 of the wettable material 56, thereby reducing the force required to pull the object 68 away. This reduces the time required to form cross-sections of the solid portion 82 of the object 68.

Figure 14:
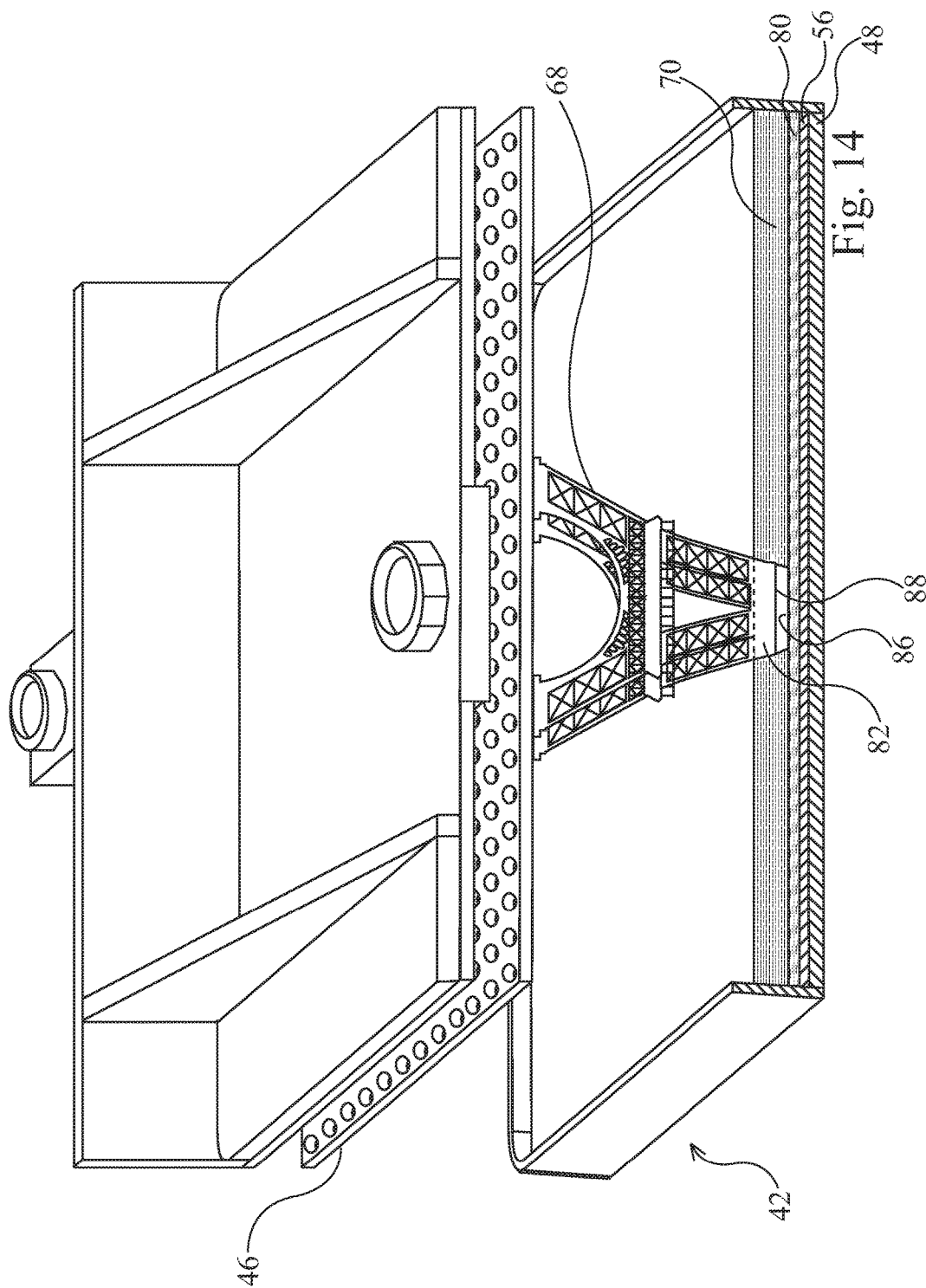
FIG. 14 is a fragmentary view of the stereolithography system of FIG. 1 showing the solid portion of the object with a relatively small cross-section being formed by continuous-layered curing of the resin with a spacing between the object and the wettable material.
Figure 15:
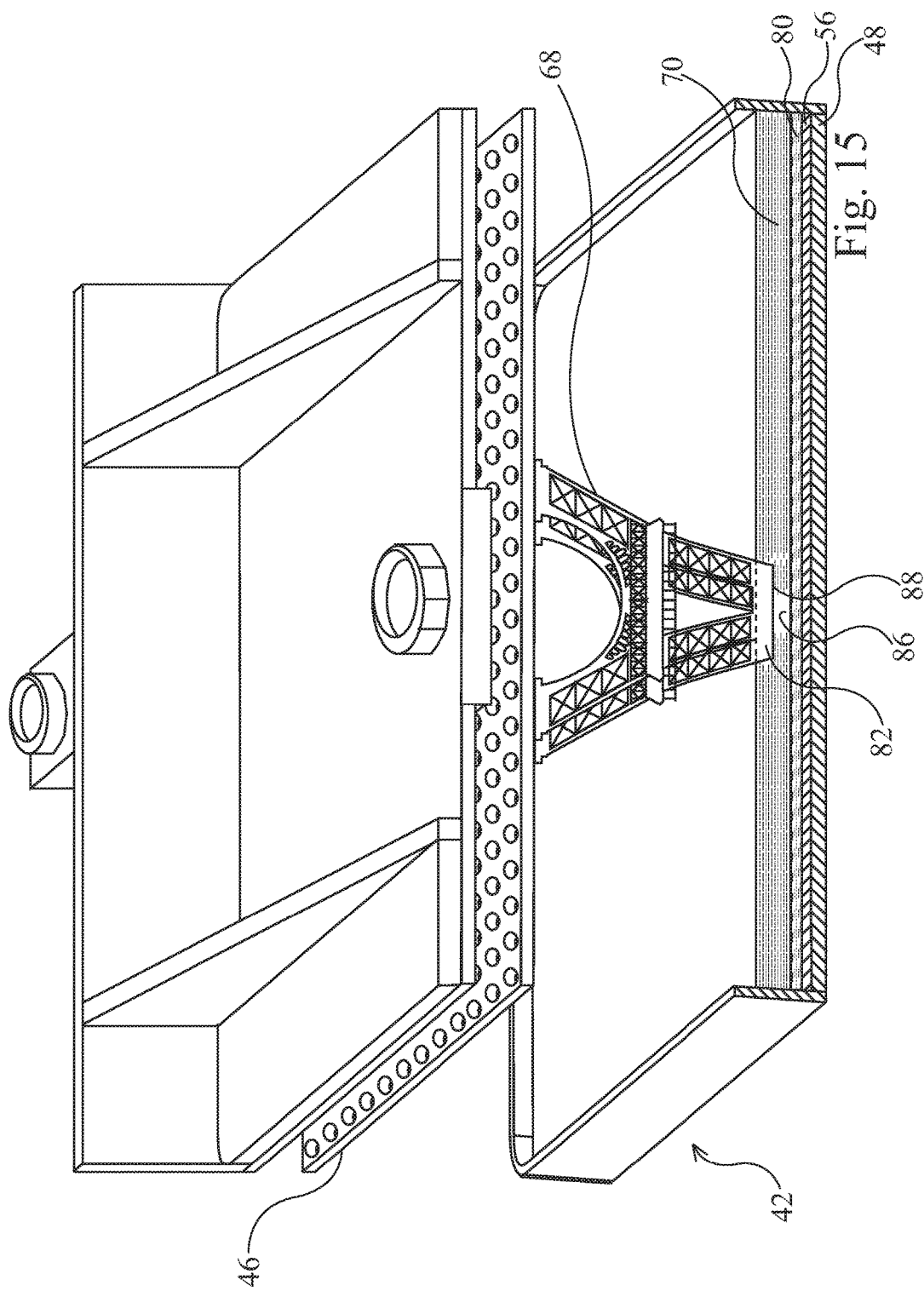
FIG. 15 is a fragmentary view of the stereolithography system of FIG. 1 showing the solid portion of the object with a relatively small cross-section being formed by continuous-layered curing of the resin with the resin partially filling a spacing between the object and the wettable material.
Figure 16:
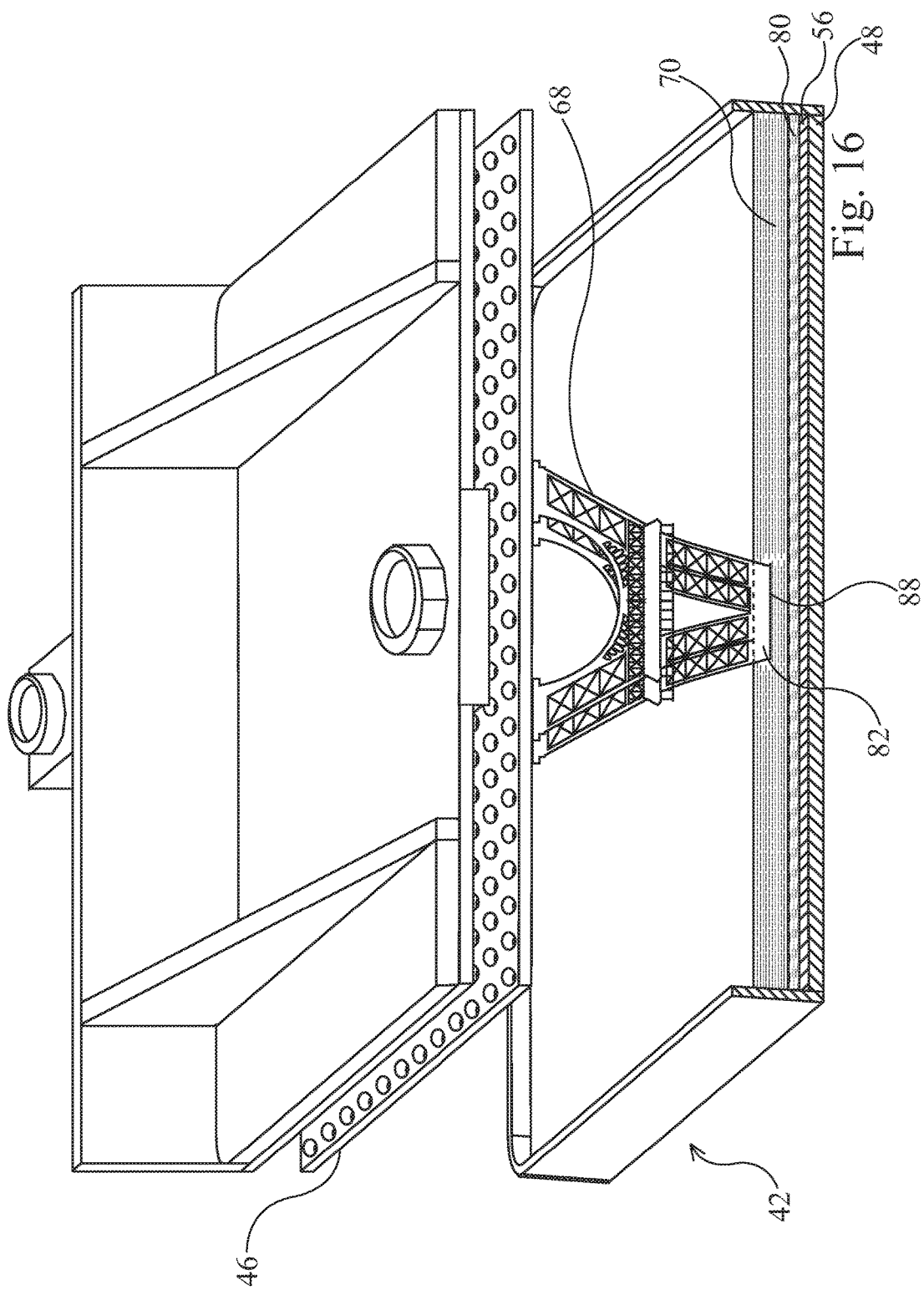
FIG. 16 is a fragmentary view of the stereolithography system of FIG. 1 showing the solid portion of the object with a relatively small cross-section being formed by continuous-layered curing of the resin with the resin partially filling a spacing between the object and the wettable material.

Referring now to FIGS. 14 to 17, the formation of air bubbles in the object 68 may also be prevented by not providing a blast or emission of light until resin fills a spacing 86 between a bottom 88 of the object 68 and the bottom wall 48 of the tank 42. During the formation of the object 68, and as best shown in FIG. 14, there is momentarily a spacing 86 between the gap 80 and the bottom 88 of the object 68 as the carrier platform 46 moves away from the bottom wall 48 of the tank 42. The spacing 86 is nearly instantaneously filled with the resin 70 as shown in FIGS. 15 and 16. However, if a cross-section of the object 68 is formed prior to the resin 70 completely filling the spacing 86, as shown in FIG. 15, then the spacing 86 forms an air bubble in the object 68 as the resin around the spacing 86 is cured during the formation of a cross-section of the object 68. It is accordingly desirable to wait until spacing 86 is substantially filled with the resin 70, as shown in FIG. 16, prior to forming a cross-section of the object 68. This may be achieved by programming a controller 74 to employ the following algorithm.

Step 1: START.

Step 2: Move the object 68 away from the bottom of the tank 48 as shown in FIG. 14.

Step 3: Momentarily emit no light as resin flows into the spacing 86 between the bottom 88 of the object 68 being formed and the gap 80 as shown in FIGS. 15 and 16.

Figure 17:
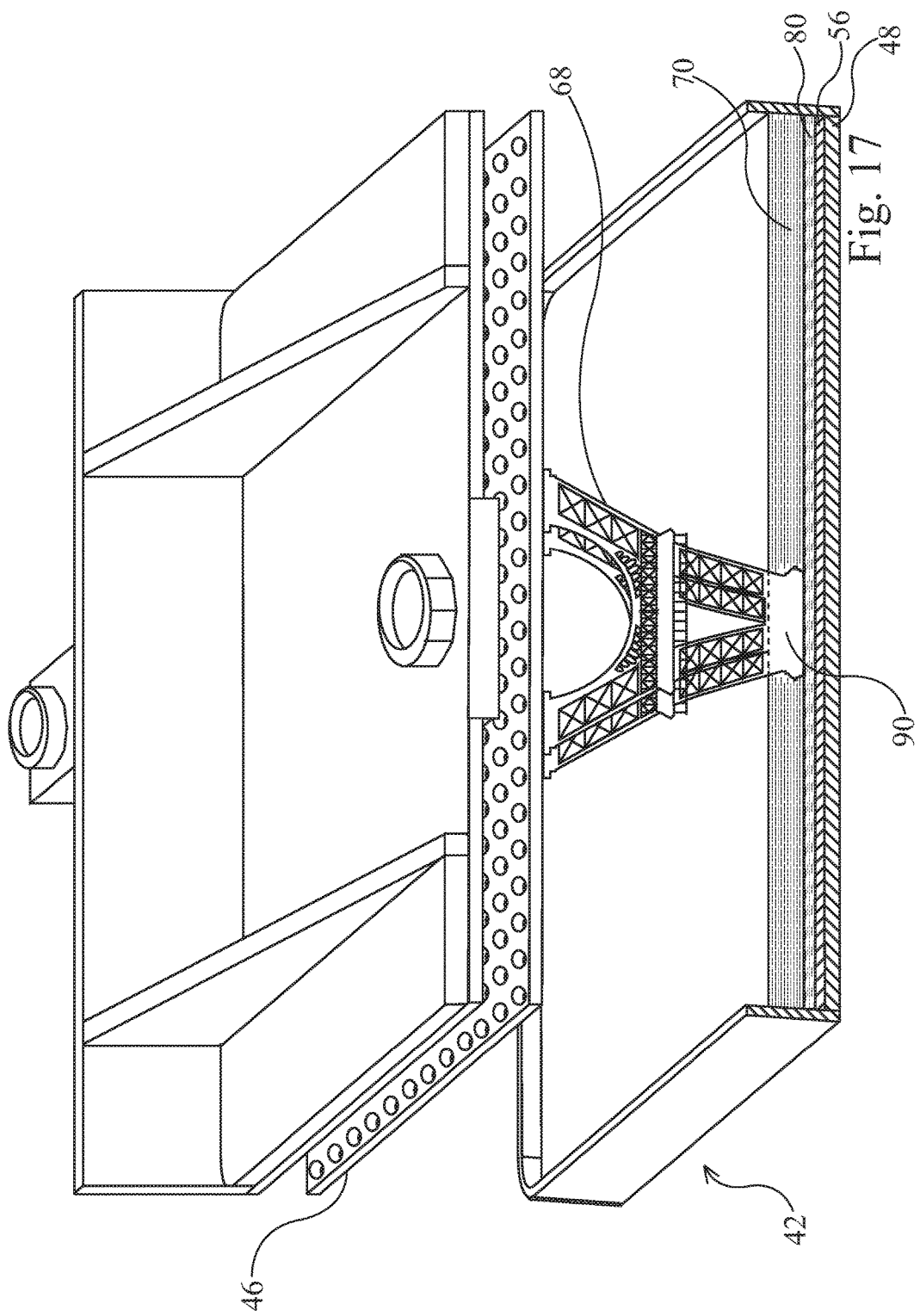
FIG. 17 is a fragmentary view of the stereolithography system of FIG. 1 showing the solid portion of the object with a relatively large cross-section being formed by layered curing of the resin.

Step 4: Emit light to cure resin to form desired cross-section of the object 68 being formed as the resin 70 fills the spacing 86 between the bottom 88 of the object 68 being formed and the gap 80 as shown in FIG. 17.

Step 5: Repeat Step 2.

Figure 18:
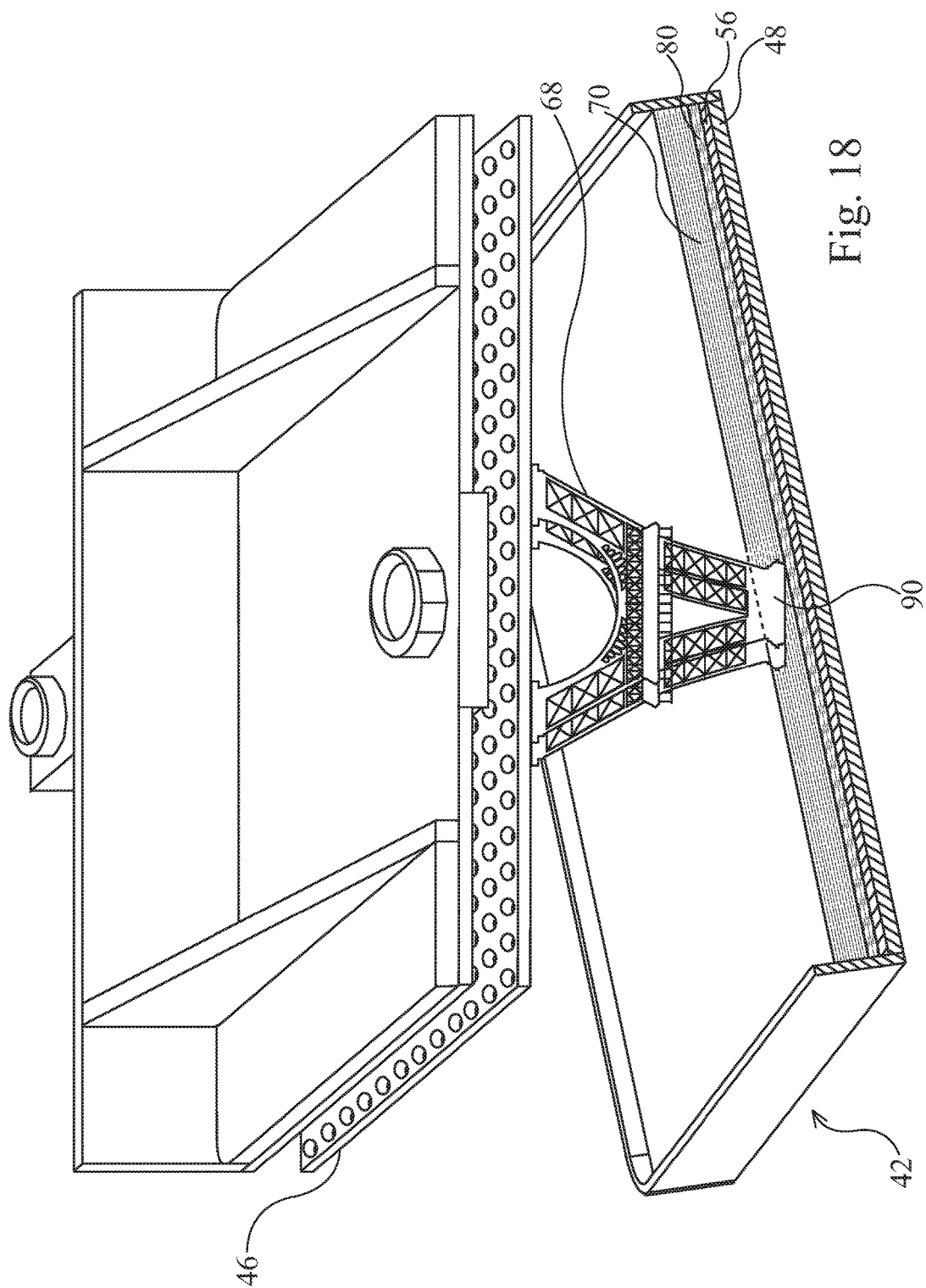
FIG. 18 is a fragmentary view of the stereolithography system of FIG. 1 showing the solid portion of the object with a relatively large cross-section being formed by layered curing of the resin with the tank being tilted in a first direction.
Figure 19:
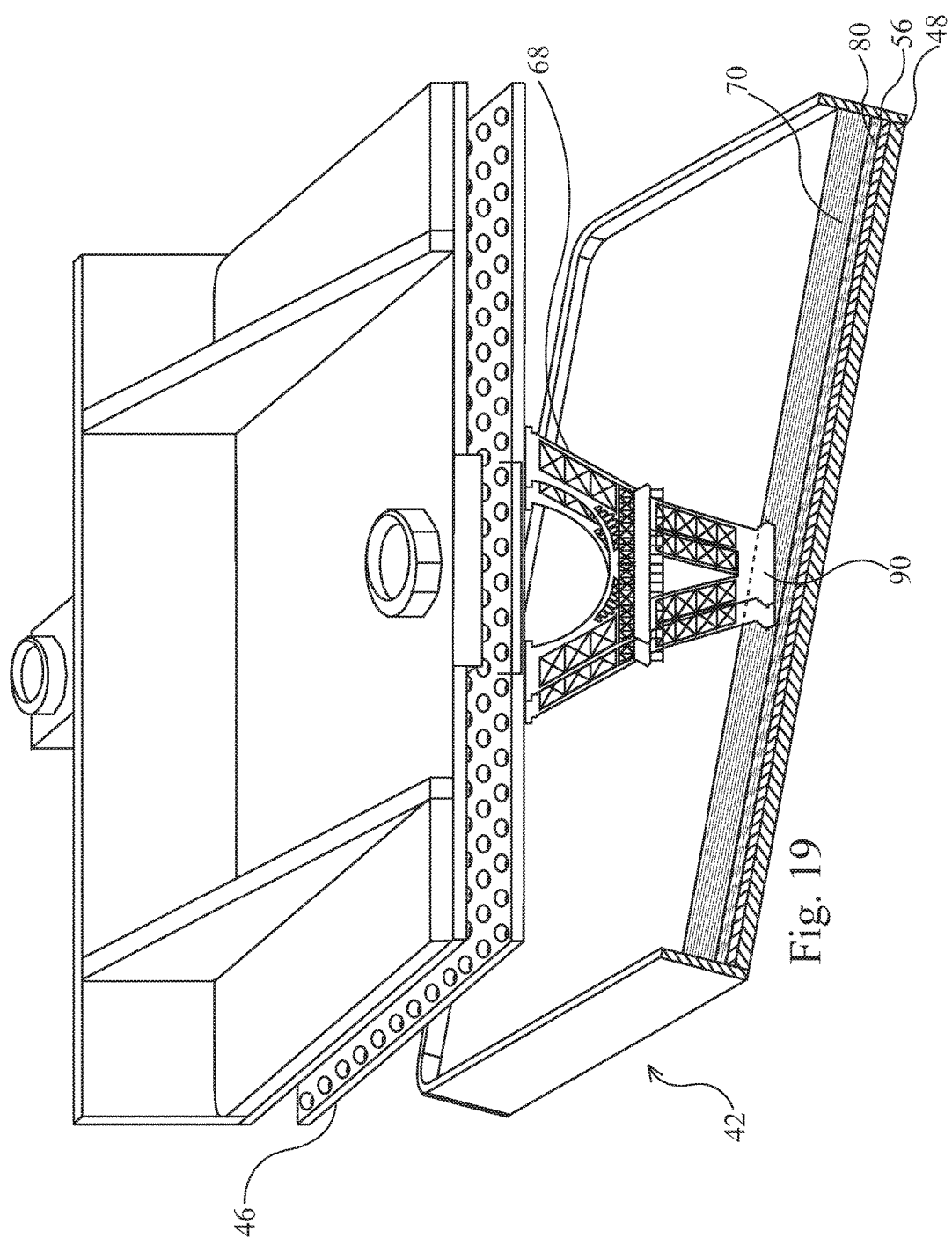
FIG. 19 is a fragmentary view of the stereolithography system of FIG. 1 showing the solid portion of the object with a relatively large cross-section being formed by layered curing of the resin with the tank being tilted in a second direction.
Figure 20:
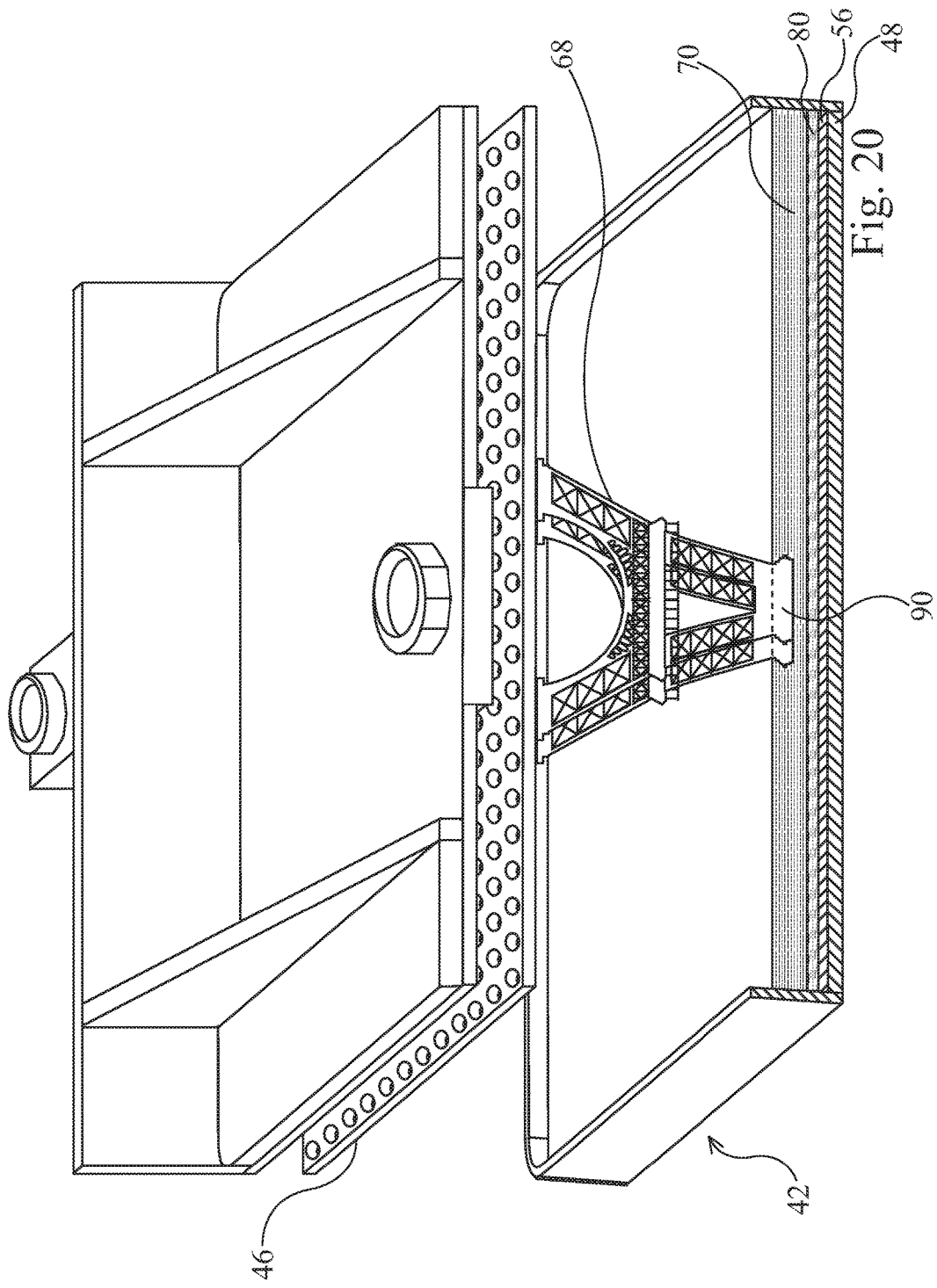
FIG. 20 is a fragmentary view of the stereolithography system of FIG. 1 showing the solid portion of the object with a relatively large cross-section being formed by layered curing of the resin.
Figure 21:
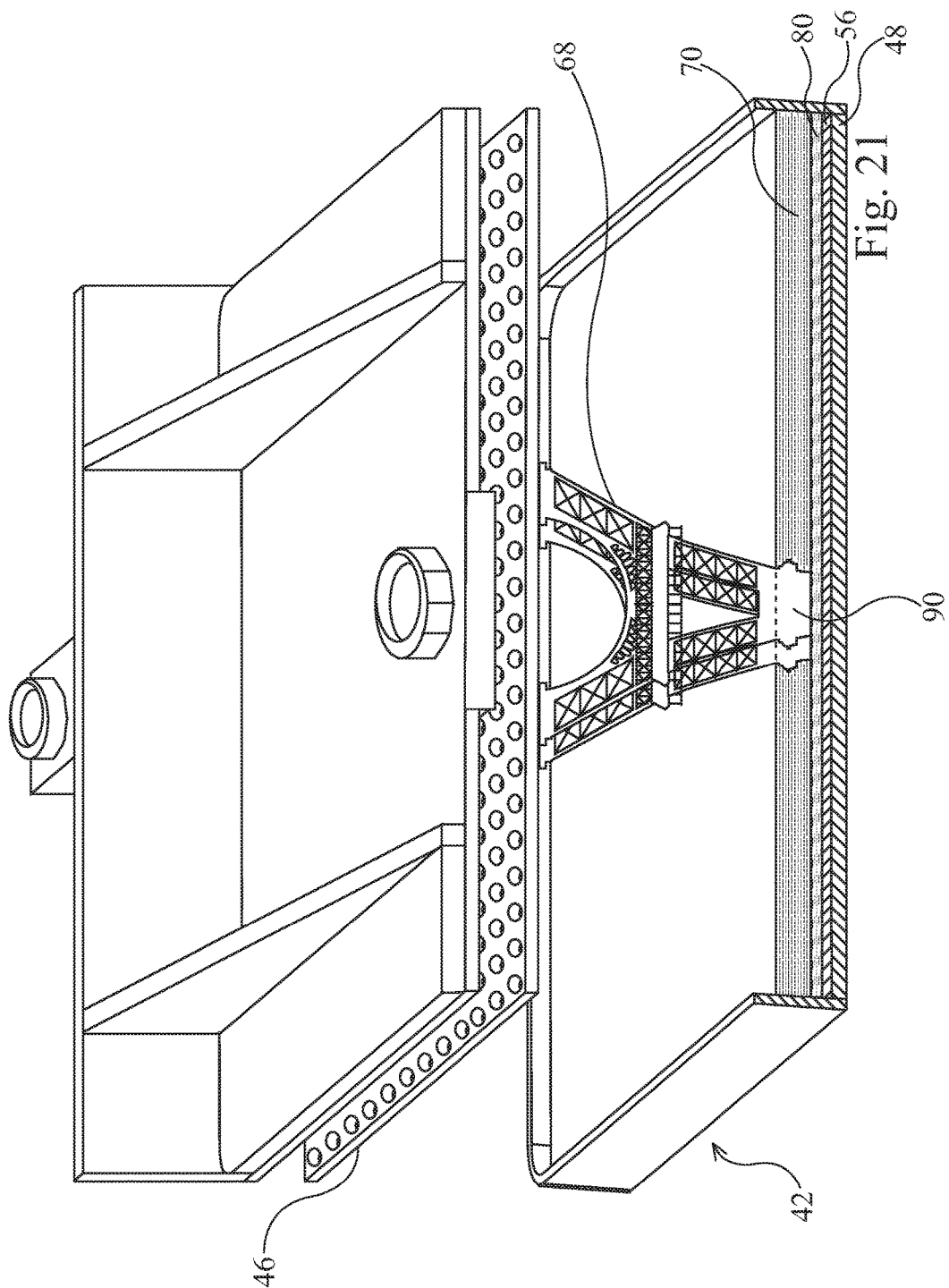
FIG. 21 is another fragmentary view of the stereolithography system of FIG. 1 showing the solid portion of the object with a relatively large cross-section being formed by layered curing of the resin.

During the formation of a solid portion 90 of the object 68 with a relatively large cross-section, as shown in FIGS. 18 to 21, it may be desirable to tilt the tank 42 to micro peel away the solid portion 90 of the object 68. The vibrators 62 and 64, shown in FIGS. 6A to 6C, vibrate alternately while the carrier platform 46 is moved away from the tank 42 as shown in FIGS. 18 and 19. This facilitates the flow of the resin 70 between the object 68 and the wettable material 56 as shown in FIG. 20. Another cross-section of the object 68 area can then be formed as shown in FIG. 21. The carrier platform 46 is repositioned and the process is repeated until the object 68 is fully formed.

The vibrators 62 and 64 may be actuated at any time light is not being emitted to cure or polymerize the resin 70. The vibrators 62 and 64 may also be used to aid the flow of the resin 70. The vibrators 62 and 64 may be positioned so that a vibrator on one side of the tank 42 vibrates upwardly while a vibrator on the opposite side of the tank vibrates downwardly. The vibrators 62 and 64 may be selectively actuated to produce a combination of vibrations that is most effective based on the cross-section of the object 68 being formed.

Figure 22:
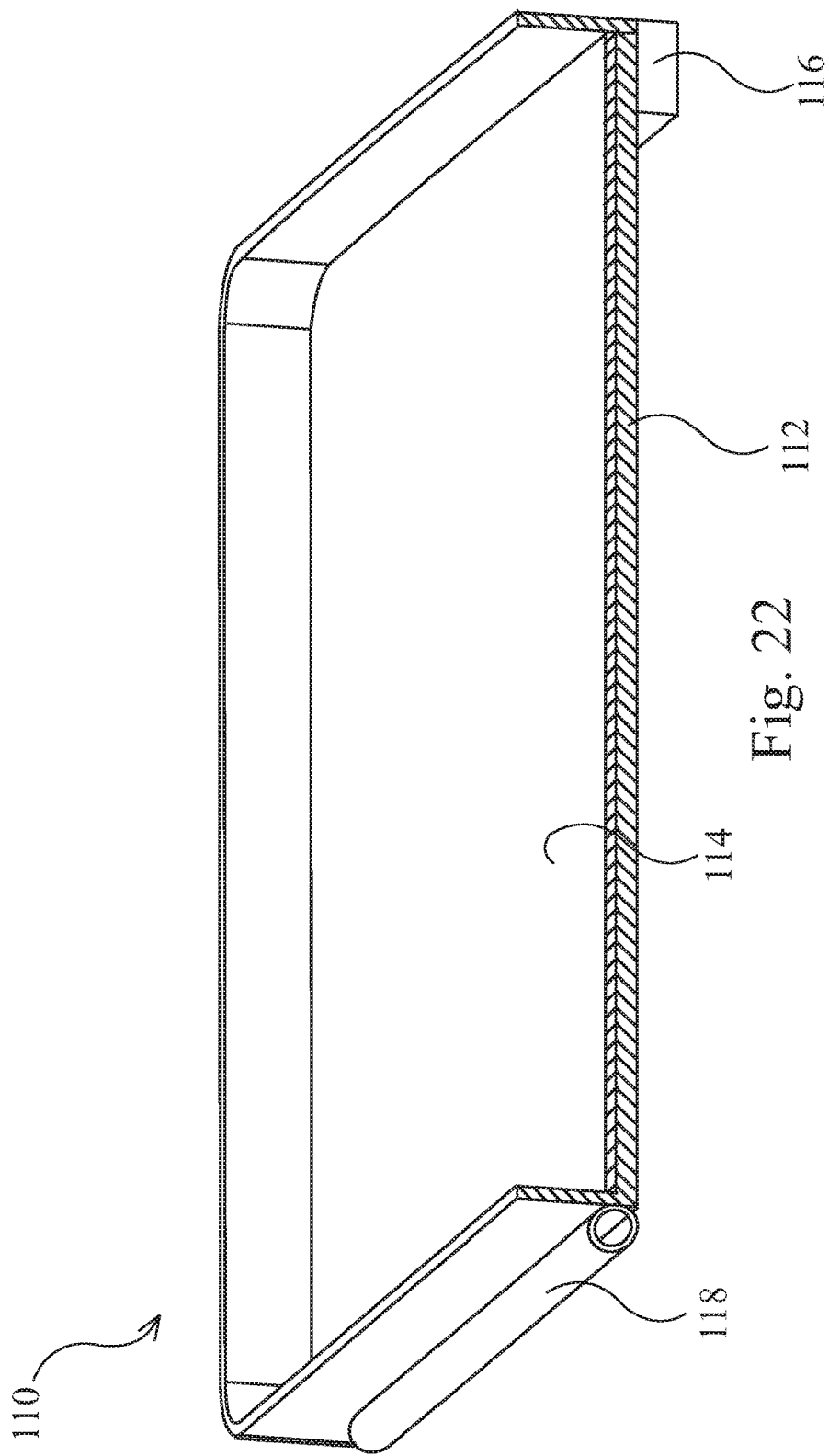
FIG. 22 is a perspective, sectional view of a second embodiment of a tank which may be used with the stereolithography system of FIG. 1.

FIG. 22 shows a second embodiment of a tank 110 that may be used with the stereolithography system 10 disclosed herein. The tank 110 is substantially similar to the tank 42 shown in FIG. 4A. The tank 110 has an optically transparent bottom wall 112 with a wettable material 114 at the bottom wall 112 of the tank 110 within the tank 110. However, the tank 110 has an actuator 116 disposed at a first side thereof and a hinge mechanism 118 at a second side thereof. In this example, the actuator 116 is a motor driven linear actuator which pivots the tank 110 about the hinge mechanism 118 in order to tilt the tank 110.

Figure 23:
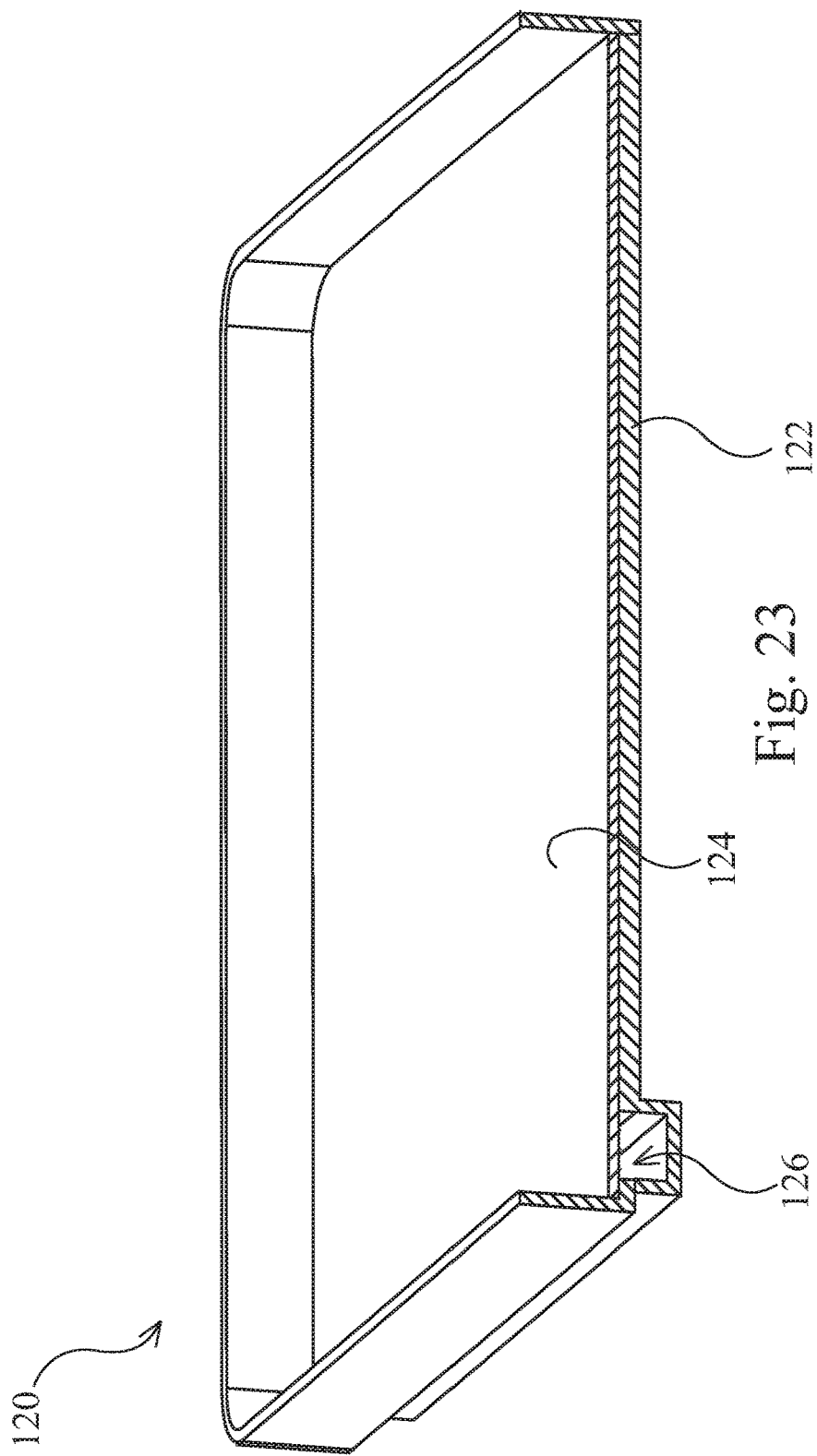
FIG. 23 is a perspective, sectional view of a third embodiment of a tank which may be used with the stereolithography system of FIG. 1.

FIG. 23 shows a third embodiment of a tank 120 which may be used with the stereolithography system 10 disclosed herein. The tank 120 is substantially similar to the tank 42 shown in FIG. 4A. The tank 120 has an optically transparent bottom wall 122 with a wettable material 124 at the bottom wall 122 of the tank 120 within the tank 120. However, the tank 120 further has a reservoir 126 in fluid communication with the wettable material 124. There may be water in the reservoir 126 which may be applied to the wettable material 124 to keep the wettable material wet.

Figure 24:
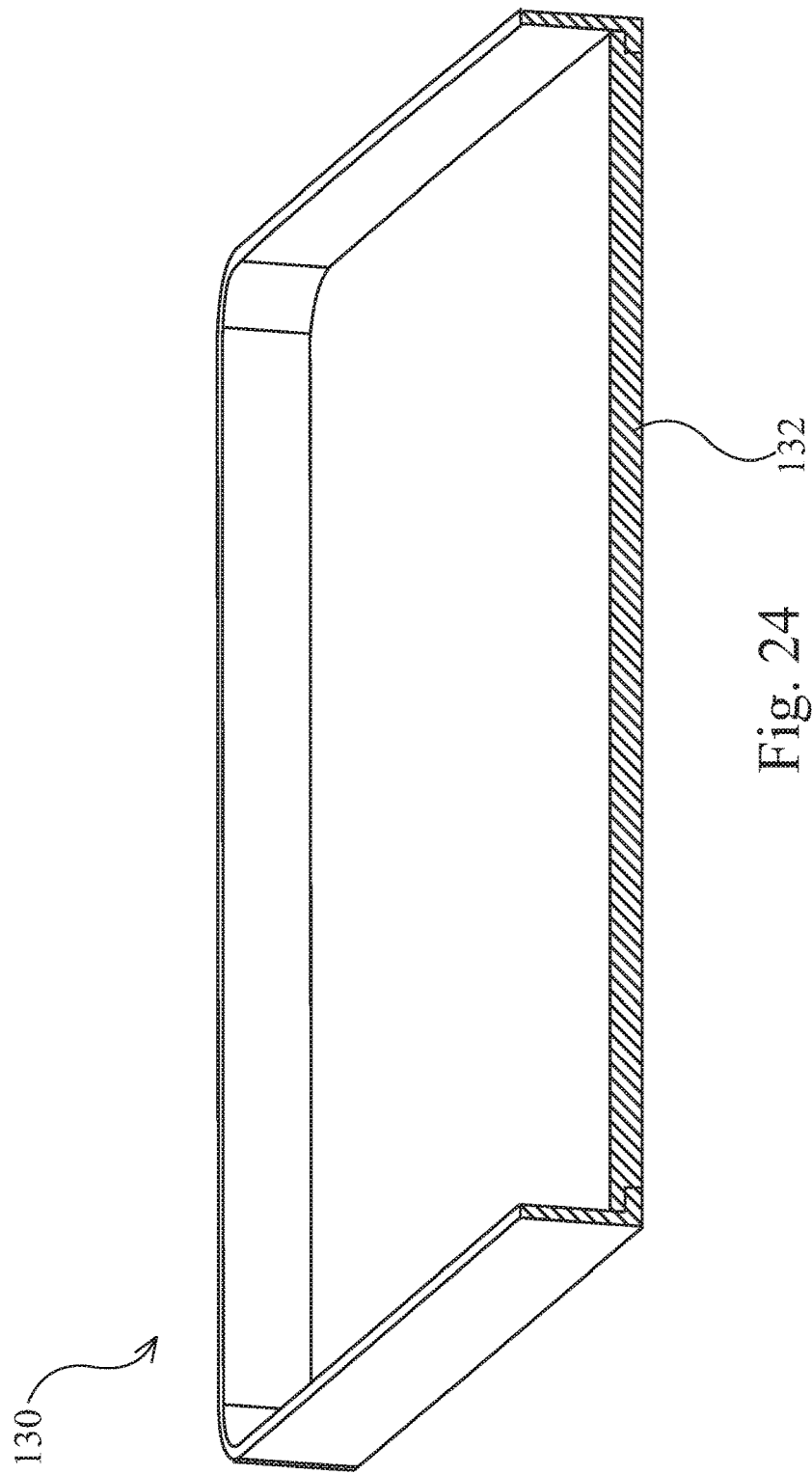
FIG. 24 is a perspective, sectional view of a fourth embodiment of a tank which may be used with the stereolithography system of FIG. 1.

FIG. 24 shows a fourth embodiment of a tank 130 which may be used with the stereolithography system 10 disclosed herein. The tank 130 is substantially similar to the tank 42 shown in FIG. 4A with the notable exception that the tank 140 has an optically transparent bottom wall 132 which is formed from a wettable material.

Figure 25:
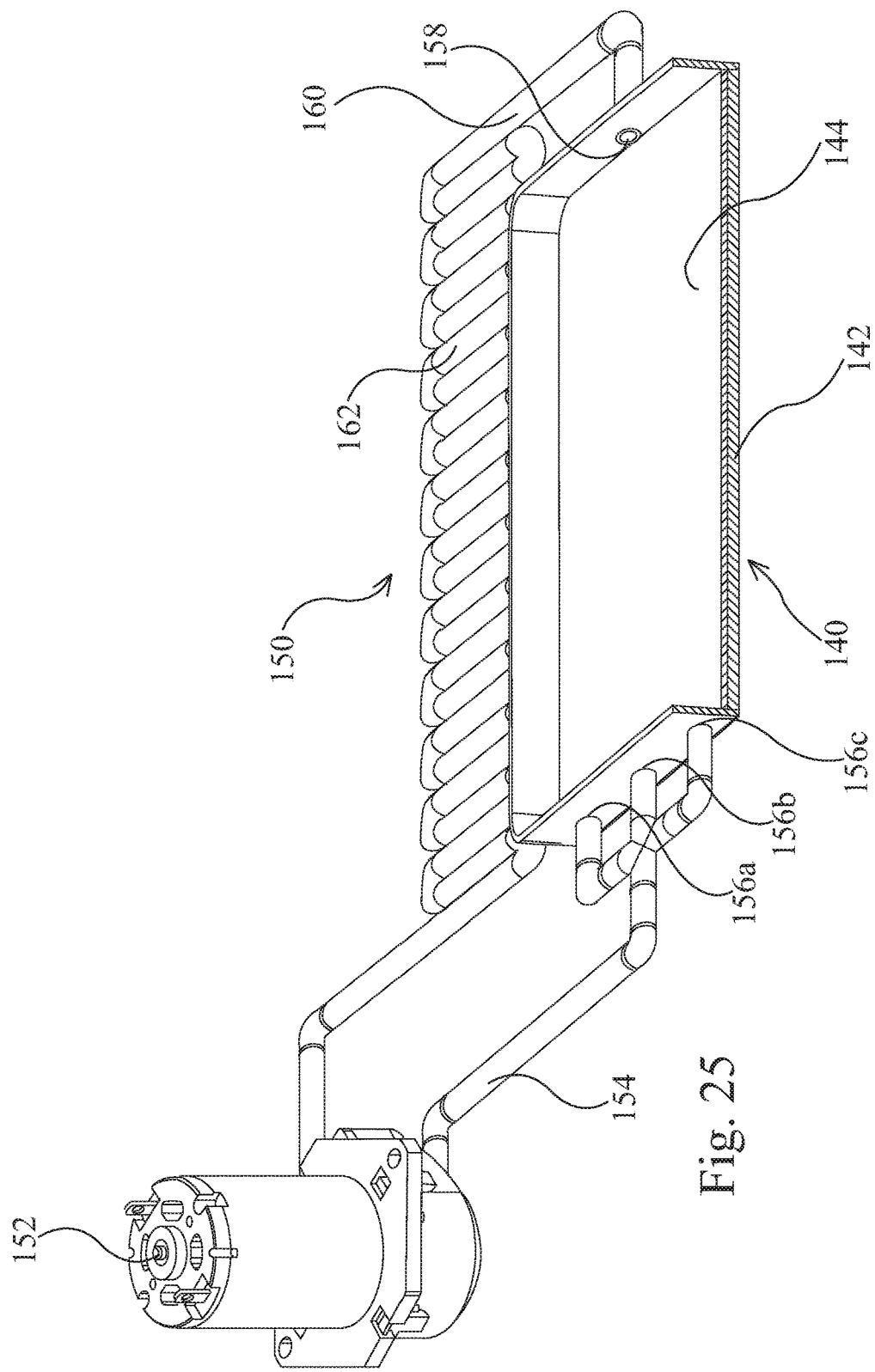
FIG. 25 is a perspective, sectional view of a fifth embodiment of a tank which may be used in with the stereolithography system of FIG. 1.

FIG. 25 shows a fifth embodiment of a tank 140 which may be used with the stereolithography system 10 disclosed herein. The tank 140 is substantially similar to the tank 42 shown in FIG. 4A. The tank 140 has an optically transparent bottom wall 142 with a wettable material 144 at the bottom wall 142 of the tank 140 within the tank 140. However, the tank 140 is further provided with a closed-loop resin recirculation and/or resin cooling system 150 which includes a pump 152 which is in fluid communication with an input conduit 154. The input conduit 154 has three input ports 156a, 156b and 156c which allow fluid communication between the input conduit 154 and the tank 140. The closed-loop resin recirculation and/or resin cooling system 150 also includes an output port 158 which allows fluid communication between the tank 140 and an output conduit 160. There is a coil 162 disposed along the output conduit 160 between the output port 158 and the pump 152. In operation, the pump 152 draws resin from the tank 140 through the output port 158. The resin flows to the pump 152 through the output conduit 160 and may be cooled as it flows through the coil 162. The pump 152 then pumps the resin though the input conduit 154 and back into the tank 140 through the input ports 156a, 156b and 156c. The resin flows into the tank 140 at a flow rate of about 100 mm per minute to minimize turbulence in the resin and flows into the tank 140 adjacent to the bottom wall 142 thereof. It will be understood by a person skilled in the art that a closed-loop resin recirculation and/or resin cooling system may also be used with a tank in a conventional "top-down" stereolithography system.

Figure 26:
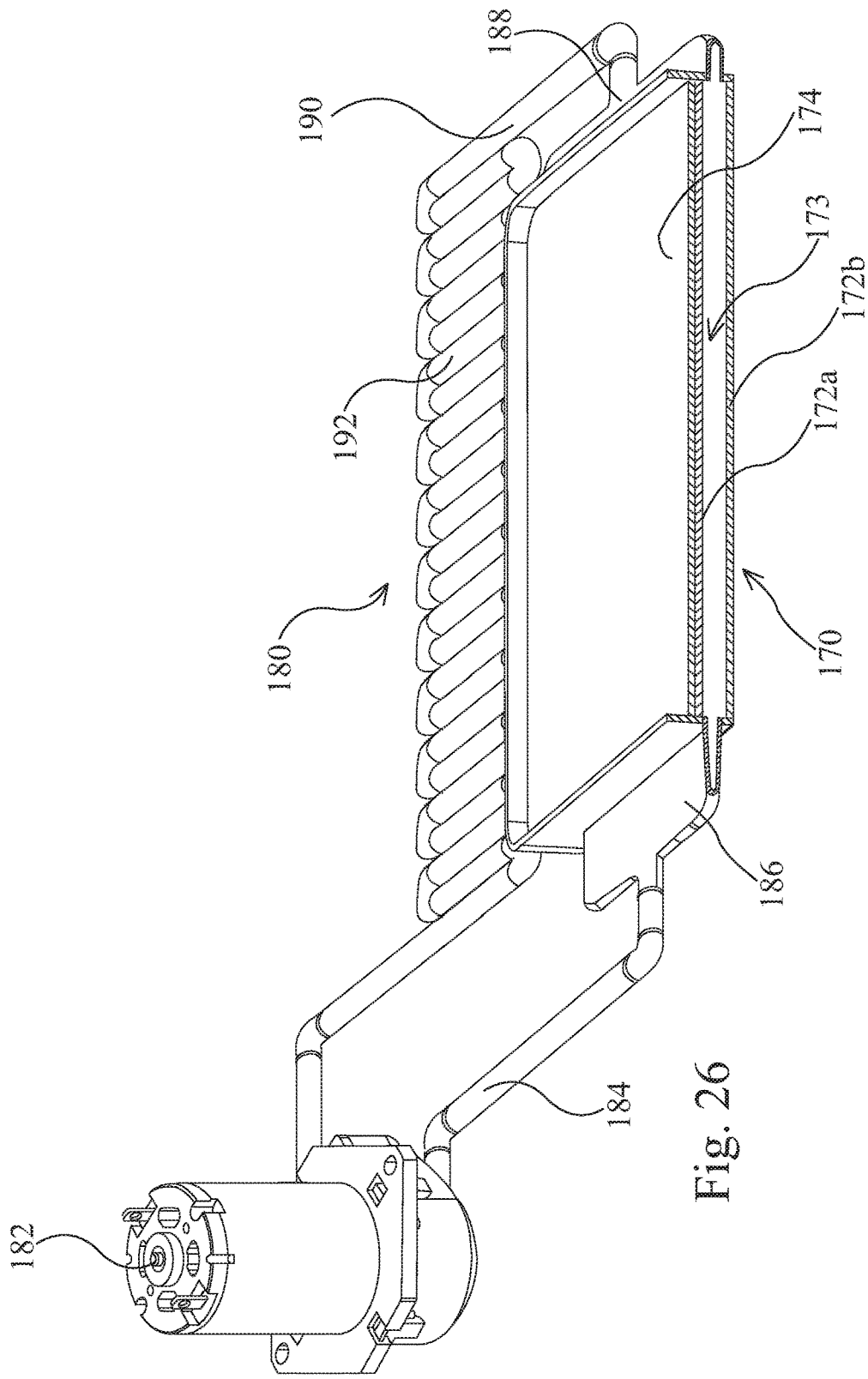
FIG. 26 is a perspective, sectional view of a sixth embodiment of a tank which may be used in with the stereolithography system of FIG. 1.

FIG. 26 shows a sixth embodiment of a tank 170 which may be used with the stereolithography system 10 disclosed herein. The tank 170 has a first optically transparent bottom wall 172a and a second optically transparent bottom wall 172b. The first bottom wall 172a of the tank 170 and the second bottom wall 172b of the tank 170 are spaced apart and there is a space 173 therebetween. The wettable material 174 is at the first bottom wall 172a of the tank 170 within the tank 170. The tank 170 is further provided with a closed-loop fluid cooling system 180 which includes a pump 182 which is in fluid communication with an input conduit 184. The input conduit 184 has an input port 186 which allows fluid communication between the input conduit 184 and the space 173 between the first bottom wall 172a of the tank 170 and the second bottom wall 172b of the tank 170. The closed-loop fluid cooling system 180 also includes an output port 188 which allows fluid communication between an output conduit 190 and the space 173, between the first bottom wall 172a of the tank 170 and the second bottom wall 172b of the tank 170. There is a coil 192 disposed along the output conduit 190 between the output port 188 and the pump 182. In operation, the pump 182 pumps fluid into the space 173 between the first bottom wall 172a of the tank 170 and the second bottom wall 172b of the tank 170. The fluid may be air or water which is used to cool the first bottom wall 172a of the tank 170 and prevent thermal damage to the wettable material 174. The fluid is then drawn through the output port 188 and flows to the pump 182 through the output conduit 190 and may be cooled as it flows through the coil 192. The pump 182 then pumps the cooled fluid through the input conduit 184 and back into the space 173 between the first bottom wall 172a of the tank 170 and the second bottom wall 172b of the tank 170 through the input port 186. It will be understood by a person skilled in the art that a closed-loop fluid cooling system may also be used with a tank in a conventional "top-down" stereolithography system.

Figure 27:
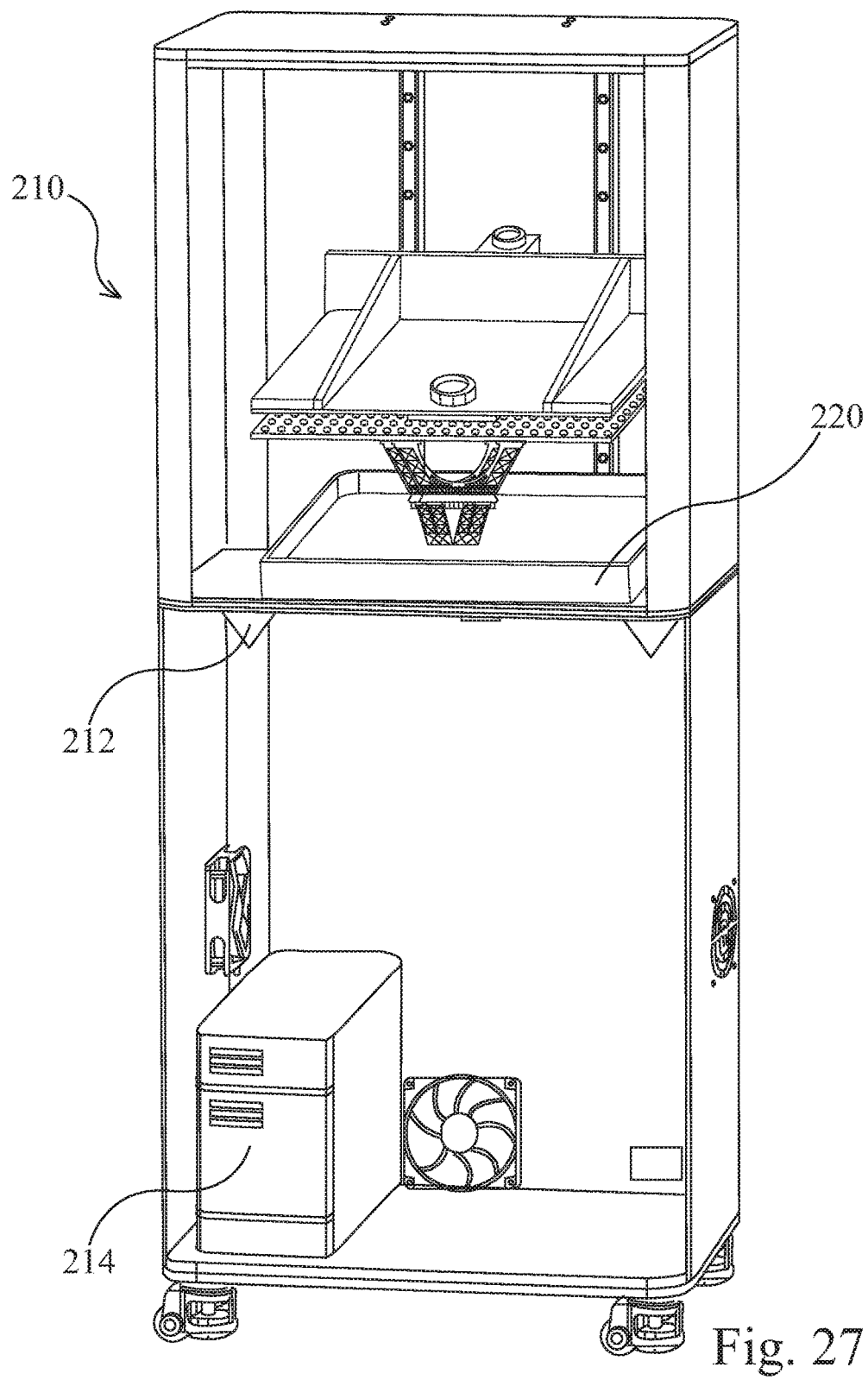
FIG. 27 is a perspective view of another improved stereolithography system.
Figure 28:
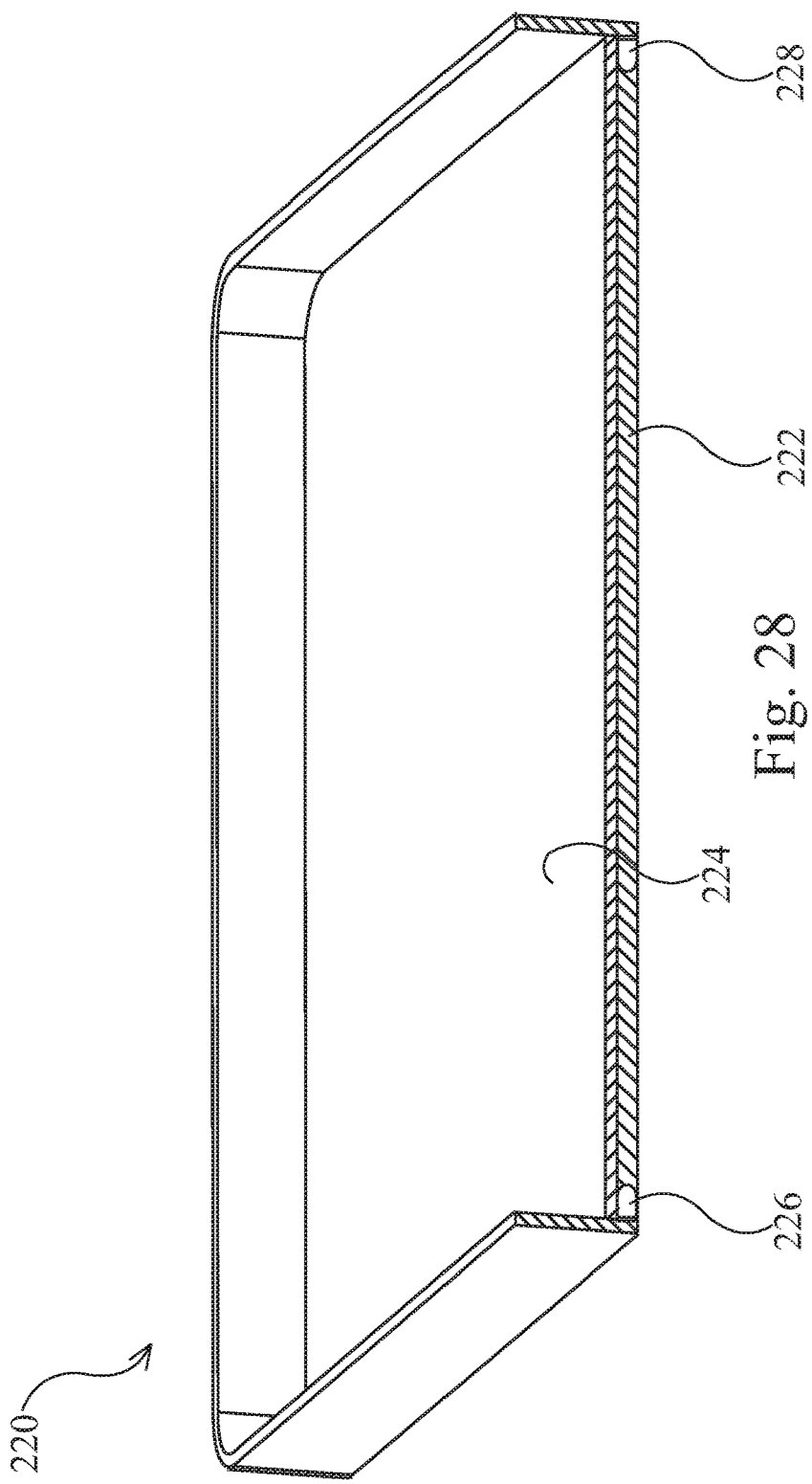
FIG. 28 is a perspective, sectional view of a tank of the stereolithography system of FIG. 27.

FIG. 27 shows another improved stereolithography system 210, which is substantially identical to the sterolithography system 10 shown in FIG. 7, with the notable exceptions that the light-emitting device 240 is integrated with the tank 220 and that the cooling device of the sterolithography system 210 is an air knife 212. The tank 220 is shown in greater detail in FIG. 28 and is generally similar to the tank 42 shown in FIG. 4A. The tank 220 has an optically transparent bottom wall 222 with a wettable material 224 at the bottom wall 222 of the tank 220 within the tank 220. However, the bottom wall 222 of the tank 220 further includes a plurality of light-emitting devices, for example, light-emitting devices 226 and 228, disposed along a peripheral edge thereof. The light-emitting devices provide a continuous emission of light to form an object. The bottom wall of the tank may be a modified LCD monitor in which white back lights of the LCD monitor are replaced with UV LED lights which function as light-emitting devices. This allows an image that would have previously been projected on the LCD monitor in white light to be continuously projected in a blast or emission of UV light to form an object in the shape of the image. It will be understood by a person skilled in the art that a modified LCD monitor in which white back lights of the LCD monitor are replaced with UV LED lights which function as light-emitting devices may also be used as a bottom wall of a tank in a conventional "top-down" stereolithography system.

Figure 29:
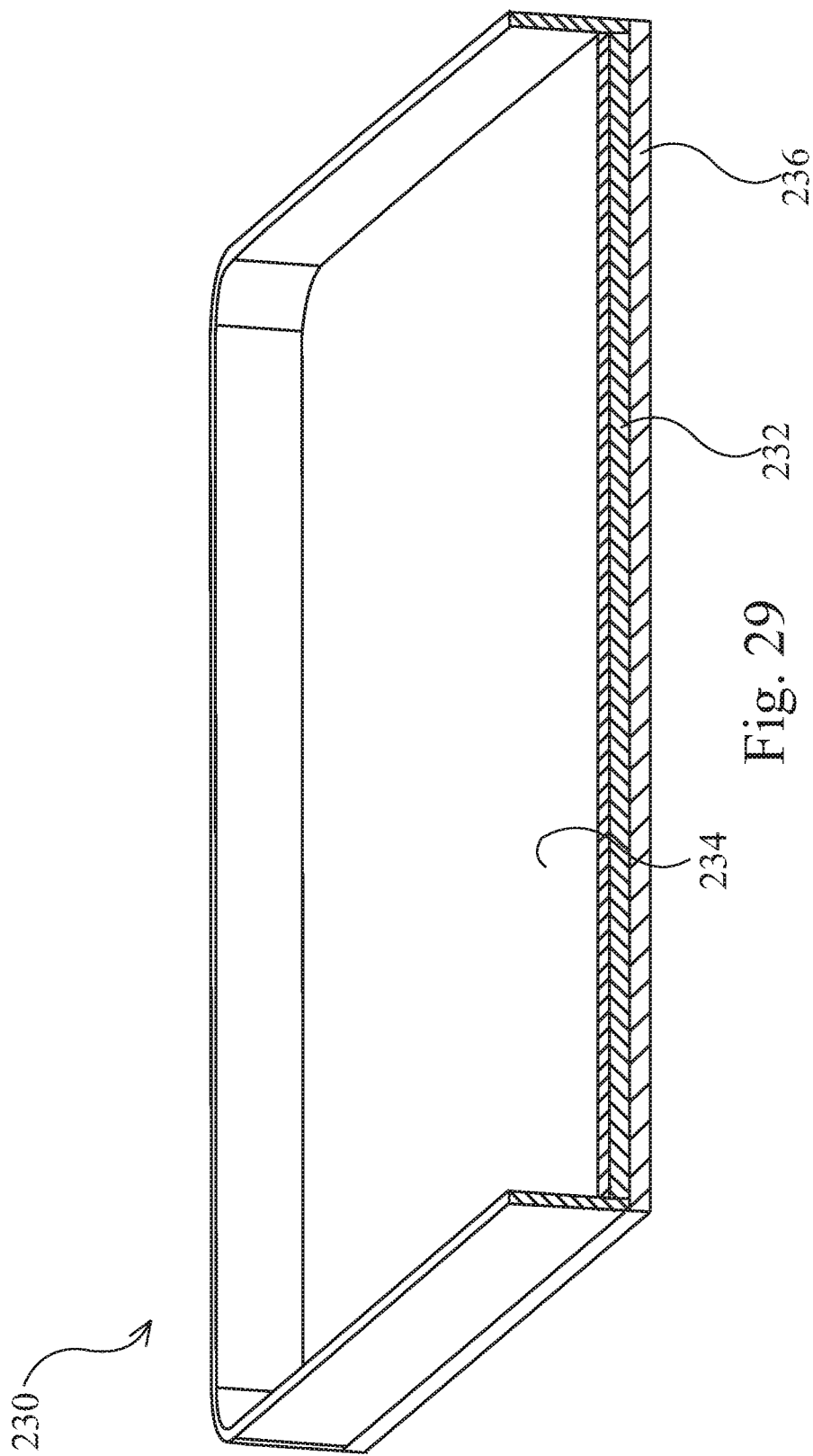
FIG. 29 is a perspective, sectional view of a second embodiment of a tank which may be used with the stereolithography system of FIG. 27.

FIG. 29 shows a second embodiment of a tank 230 which may be used with the stereolithography system disclosed herein. The tank 230 is substantially similar to the tank 42 shown in FIG. 4A. The tank 230 has an optically transparent bottom wall 232 with a wettable material 234 at the bottom wall 232 of the tank 230 within the tank 230. However, there is a UV organic light-emitting diode (OLED) 236 at the bottom wall 232 of the tank 230. The UV OLED functions as the light-emitting device. It will be understood by a person skilled in the art that a UV OLED functioning as a light-emitting device may also be used with a tank in a conventional "top-down" stereolithography system.

Figure 30:
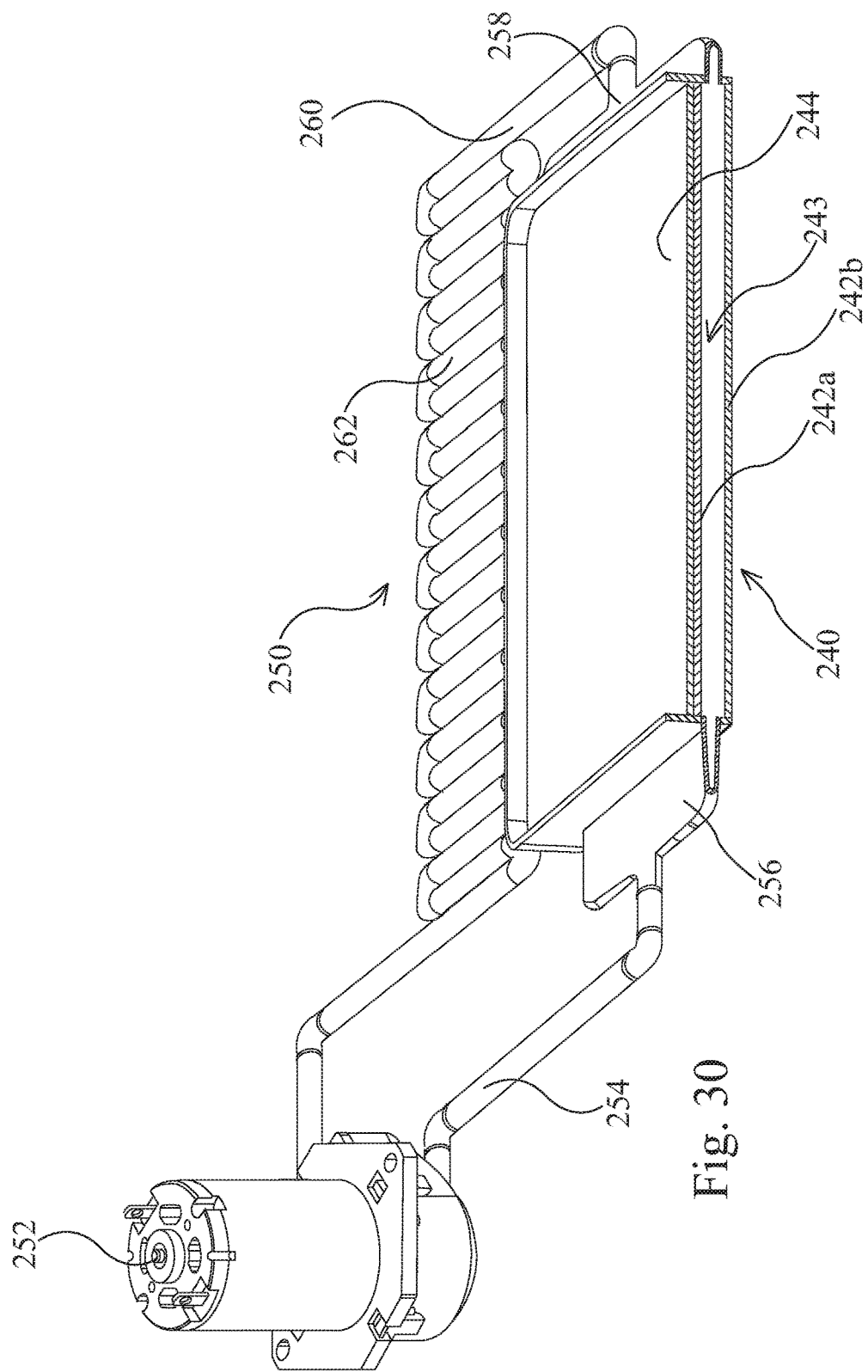
FIG. 30 is a perspective, sectional view of a second embodiment of a tank which may be used with the stereolithography system of FIG. 27

FIG. 30 shows a third embodiment of a tank 240 which may be used with the stereolithography system 10 disclosed herein. The tank 240 has a first optically transparent bottom wall 242a and a second bottom wall 242b in the form of a UV organic light-emitting diode (OLED) which functions as the light-emitting device. The first bottom wall 242a of the tank 240 and the second bottom wall 242b of the tank 240 are spaced apart and there is a space 243 therebetween. The wettable material 244 is at the first bottom wall 242a of the tank 240 within the tank 240. The tank 240 is further provided with a closed-loop fluid cooling system 250 which includes a pump 252 which is in fluid communication with an input conduit 254. The input conduit 254 has an input port 256 which allows fluid communication between the input conduit 254 and the space 243 between the first bottom wall 242a of the tank 240 and the second bottom wall 242b of the tank 240. The closed-loop fluid cooling system 250 also includes an output port 258 which allows fluid communication between an output conduit 260 and the space 243, between the first bottom wall 242a of the tank 240 and the second bottom wall 242b of the tank 240. There is a coil 262 disposed along the output conduit 260 between the output port 280 and the pump 252. In operation, the pump 252 pumps fluid into the space 243 between the first bottom wall 242a of the tank 240 and the second bottom wall 242b of the tank 240. The fluid may be air or water which is used to cool the first bottom wall 242a of the tank 240 and prevent thermal damage to the wettable material 244. The fluid is then drawn through the output port 258 and flows to the pump 252 through the output conduit 260 and may be cooled as it flows through the coil 262. The pump 252 then pumps the cooled fluid through the input conduit 254 and back into the space 243 between the first bottom wall 242a of the tank 240 and the second bottom wall 242b of the tank 240 through the input port 256. It will be understood by a person skilled in the art that a closed-loop fluid cooling system may also be used with a tank in a conventional "top-down" stereolithography system.

The sterolithography system 210 is also provided with a controller 214 which controls the light-emitting devices integrated with the tank.

Figure 31:
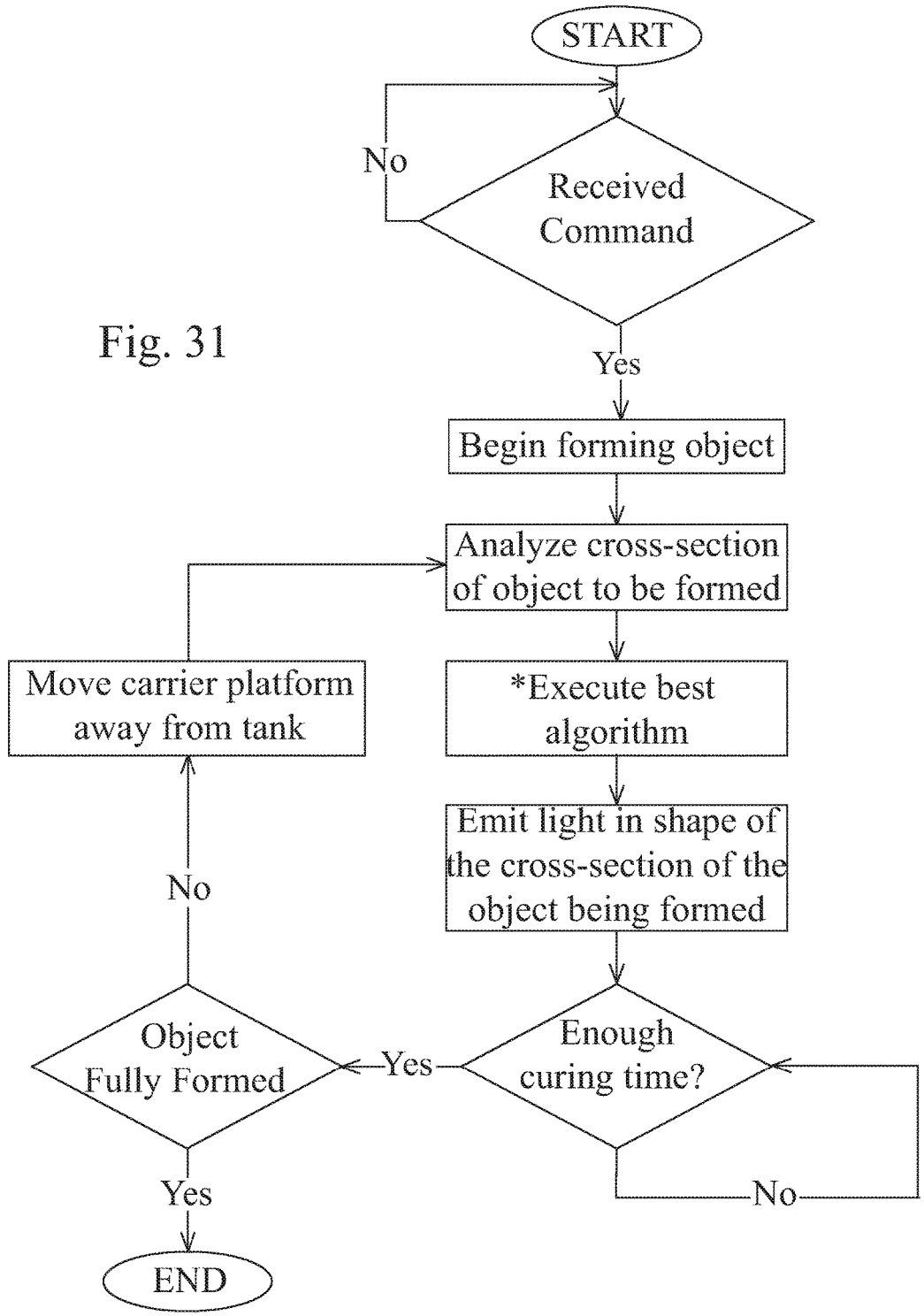
FIG. 31 is a flow chart showing the logic of the controllers of the sterolithography systems disclosed herein.

FIG. 31 is a flow chart showing the logic of the controllers of the sterolithography systems disclosed herein. When executing the best algorithm the controller determines whether the object should be formed by continuous, continuous-layered or layered curing of the resin.

Wettable Material

The wettable material 56 may be a hydrogel, e.g. silicone hydrogel, or any other suitable wettable material which results in the gap 80 or "dead zone" at the interface between the wettable material 56 and resin in the tank 42 as shown in FIGS. 21 to 29. The gap 80 may be a result of intermolecular forces of repulsion between the wettable material 56 and the resin in the tank 42 and/or the gap 80 may be the result of a layer of water which separates the wettable material 56 and the resin because the resin and water are immiscible. The separation between the wettable material 56 and the resin may be improved by adding glycerin to the wettable material 56 since glycerin is immiscible with the resin. The separation between the wettable material 56 and the resin may be further improved by adding a UV inhibitor and glycerin to the wettable material 56. Addition of the UV inhibitor and glycerin prevents the curing of a very thin layer of the resin at the interface between the wettable material 56.

The concentrations of glycerin and UV inhibitor in the wettable material 56 depend on the type of resin being used. The concentration of glycerin in the wettable material 56 may be as low as 1% by volume for a hydrogel-based wettable material and as high as 95% by volume for a glycerin gel-based wettable material. The concentration of UV inhibitor in the wettable material 56 may be between 0.5% by volume and 25% by volume. High reactive resins, which contain more photoinitiators, may require more glycerin and more UV inhibitor while low reactive resins, which contain less photoinitiators, may require less glyercine and less UV inhibitor.

Hydrogel-Based Wettable Materials

The hydrogel used in the wettable material 56 may be prepared by any means with the following general means being exemplary:

A poly(acrylic acid) hydrogel may be prepared in a solution of acrylic acid and/or salts thereof with a water soluble cross-linker, e.g. methylene bis-acrylamide, in an aqueous solution with a concentration of 10% to 70% and using methoxyhydroquinone (MHC) as an inhibitor. This may result in a gel-elastic product, crystalline, that can be dried and pulverized for storage.

A superabsorbent hydrogel may be prepared as a mixture of acrylamide as a monomer with bis-acrylamide as a cross-linker diluted in deionized water.

A polyethylene glycol hydrogel may be prepared by cross-linking a polyethylene glycol acrylate using a radical generator (UV initiator) then stabilizing the hydrogel using volume monomethylether hydroquinone (MEHQ) as an inhibitor.

A physically cross-linked hydrogel may be prepared by warming Kappa-Carrageenan in a solution until a helix shape in the molecule is formed. The additional use of a solution containing a salt (Na+, K+) will result in further helices aggregating to form a stable gel.

A sodium alginate hydrogel may be prepared as a mixture of wt. 2% sodium alginate poured into a mixture of 1 wt. % of calcium chloride.

A patterned poly(ethylene glycol)-based hydrogel may be prepared by dissolving poly(ethylene glycol) in an aqueous solution with 2,2 dimethoxy-2-phenyl acetophenone as a photoinitiator. A photolithography technique is used during the UV curing process to obtain the desired pattern.

A PEGDA lyophilized gel may be prepared by mixing freeze-dried PEGDA with water and a photoinitiator and exposed to UV light (365 nm) to form a hydrogel structure.

A polyvinyl pyrrolidone-based hydrogel may be prepared by mixing polyvinyl pyrrolidone with hydrogen peroxide as required for the specific application and using UV light (254 nm) to cross-link to form gel structures.

Collagen/HEMA hydrogel may be prepared by using a collagen solution mixed with HEMA monomer, ammonium persulfate and sodium metabisulfate.

A polyhydroxyethylmethacrylate hydrogel may be prepared by mixing SucMA, hydroxyethylmethacrylate using tripropylene glycol diacrylate as a cross-linker and ammonium persulfate and sodium metabisulfate as radical initiators.

A polyhydroxyethylmethacrylate hydrogel may also be prepared by thermal polymerization. Hydroxymethlmethacrylate may be polymerized with trimetil propane trimethacrylate as a cross-linker and benzoil peroxide as a radical initiator. The mixture is then warmed to 75° C. for a period of time according to the characterization of the hydrogel.

The above mentioned hydrogels and 20% to 50% concentrated hydrogen peroxide may be used to prepare the wettable material using a mixture of between 40 ml and 60 ml hydrogel, and 60 ml and 80 ml hydrogen peroxide. The above mentioned hydrogels may also be used to prepare the wettable material using a mixture of hydrogel and perfluorocarbons. This may result in an oxygen rich wettable material with a surface layer which inhibits polymerization.

The above mentioned hydrogels may also be used to prepare the wettable material using a mixture of hydrogel together with a hydrogen donor and an oxygen scavenager. Specific examples of hydrogels are provided below.

Example 1

A hydrogel-based wettable material may include 1% by volume agar, 25% by volume glycerin, 0.5% by volume monomethylether hydroquinone (MEHQ), 1% by volume Germane II, 72.5% by volume deionized water.

Deionized water is added to a mixing tank ensuring a good vortex then monomethylether hydroquinone, glycerin, Germane II, and agar are slowly added. Mixing occurs for at least four hours.

Preparation for casting the hydrogel is done by heating the desired volume of mixture to 95° C. and holding the temperature at 95° C. for five minutes or until the mixture homogeneous. The mixture is poured into a mould and allowed to set for twenty-four to forty-eight hours.

The concentration of agar may be increased in order to achieve better mechanical strength of the hydrogel.

The concentration of glycerin may be varied in order to achieve better mechanical strength or to achieve better heat resistance.

The concentration of monomethylether hydroquinone can be varied in order to achieve further inhibition of the resin polymerization during the printing process, consequently lowering or increasing the gap or "dead zone".

Example 2

A hydrogel-based wettable material may include 1% by volume agar, 25% by volume glycerin, 0.5% by volume monomethylether hydroquinone (MEHQ), 1% by volume Germane II, 72.5% by volume of 15% concentrated hydrogen peroxide diluted in deionized water.

Deionized water is added to a mixing tank ensuring a good vortex then monomethylether hydroquinone, glycerin, Germane II, and agar are slowly added. Mixing occurs for at least four hours. The concentrated hydrogen peroxide is added just before heating the mixture for casting.

Preparation for casting the hydrogel is done by heating the desired volume of mixture to 95° C. and holding the temperature at 95° C. for five minutes or until the mixture is homogeneous. The mixture is poured into a mould and allowed to set for twenty-four to forty-eight hours.

The concentration of hydrogen peroxide can be varied in order to increase the inhibition of the resin polymerization during the printing process.

Example 3

A hydrogel-based wettable material may include 1% to 2% by volume agar, 25% by volume glycerin, 0.5% by volume monomethylether hydroquinone (MEHQ), 1% by volume Germane II, 0.4% to 2% by volume polyvinyl alcohol (PVA), 69.5% to 72.1% by volume deionized water.

Deionized water is added to a mixing tank ensuring a good vortex then monomethylether hydroquinone, glycerin, Germane II, agar, and polyvinyl alcohol are slowly added. Mixing occurs for at least four hours.

Preparation for casting the hydrogel is done by heating the desired volume of mixture to 95° C. and holding the temperature at 95° C. for five minutes or until the mixture is homogeneous. The mixture is poured into a mould and allowed to set for twenty-four to forty-eight hours.

The concentration of polyvinyl alcohol can be varied in order to improve mechanical properties.

Concentrated hydrogen peroxide diluted in deionized water can be added to the mixture in order to increase the inhibition of the resin polymerization during the printing process.

Example 4

A hydrogel-based wettable material may include polyethylene glycol diacrylate (PEGDA) prepared using an accelerator solution consisting N,N,N',N'-tetramethylethylenediamine (TMEDA) and an oxidizer agent, for example, ammonium persulfate (APS).

Polyethylene glycol diacrylate is added to an accelerator solution at a known concentration of between 5% and 30%. This solution is prepared by mixing N,N,N',N'-tetramethylethylenediamine with distilled water in a range of between 10 and 50 millimoles. An ammonium persulfate solution is prepared with a concentration range of between 10 and 50 millimoles by adding ammonium persulfate to distilled water. The reaction is carried over during two to three hours at a temperature of approximate 37° C.

A variation of this hydrogel-based wettable material may be made by substituting distilled water with hydrogen peroxide.

Example 5

A hydrogel-based wettable material may include polyethylene glycol diacrylate (PEGDA) prepared by UV light polymerization using a photoinitiator to achieve polymerization, for example, Irgacure® 819 phenylbis (2,4,6-trimethylbenzoyl)-phosphine oxide, Irgacure® 651 (2 2-dimethoxy-2-phenylacetophenone), Irgacure® 2959 (1-[4-(2-Hydroxyethoxy)-phenyl]-2-hydroxy-2-methyl-1-propane-1-one) or any other suitable photoinitiator taking in consideration the effective wavelength of the photoinitiator.

A mix of polyethylene glycol diacrylate/distilled water/photoinitiator is achieved by mixing a known amount of polyethylene glycol diacrylate to between a 5% and 30% final concentration and a photoinitiator (0.05-2.0%). The photoinitiator is added to the polyethylene glycol diacrylate, then heated to 65° C. while stirring until the photoinitiator is completely dissolved and homogenous. The mixture of polyethylene glycol diacrylate and photoinitiator is taken to the final volume by adding distilled water and stirred until the mixture is completely dissolved. This final solution is exposed to an UV light source for ten to twenty minutes to form the hydrogel. The resulting hydrogel is rinsed lightly with water to remove any unreacted chemicals.

A variation of this formula is achieved using hydrogen peroxide instead of distilled water using the same proportions described before.

Example 6

A hydrogel-based wettable material may include polyethylene glycol diacrylate (PEGDA) prepared by UV light polymerization by the means of using a photoinitiator to achieve polymerization, for example, Irgacure® 819 phenylbis (2,4,6-trimethylbenzoyl)-phosphine oxide, Irgacure® 651 (2 2-dimethoxy-2-phenylacetophenone), Irgacure® 2959 (1-[4-(2-Hydroxyethoxy)-phenyl]-2-hydroxy-2-methyl-1-propane-1-one) or any other suitable photoinitiator taking into consideration the effective wavelength of the photoinitiator and dissolved in ethanol at 70% concentration.

A solution of ethanol/photoinitiator of between 5% and 20% concentration is prepared by dissolving the photoinitiator in ethanol. The solution must be stirred and heated to 60° C. until the photoinitiator is dissolved. Once the photoinitiator is dissolved the temperature must be maintained at approximately 60° C. A polyethylene glycol diacrylate (5%-30%)/distilled $H_2O$ solution is prepared by adding a known amount of polyethylene glycol diacrylate into distilled water. The mixture is stirred until it is completely homogenous. Ethanol and photoinitiator are then added to the polyethylene glycol diacrylate/distilled $H_2O$ solution at a concentration ranging from 1-5% by volume and stirred until completely homogenous. The final solution is exposed to an UV light source for ten to twenty minutes. The resulting hydrogel is washed lightly using distilled water.

This formulation can also be achieved using hydrogen peroxide to prepare the mixtures instead of distilled water.

Example 7

A hydrogel-based wettable material include acrylamide (AAm), N,N'-methylenebisacrylamide (MBAAm), ammonium persulfate (APS) and N,N,N',N'-tetramethylethylenediamine (TEMED).

An ammonium persulfate solution with a concentration of 5% to 25% w/v is prepared. Acrylamide with a concentration of 5% to 20% w/v and N'-methylenebisacrylamide with a concentration of 0.005 to 0.020% w/v are mixed in a dry flask. A corresponding amount of distilled water is then added to achieve the desired concentrations. The resulting solution is stirred at low speed using a magnetic bar in a stirring plate until all reactants are completely dissolved. An ammonium persulfate solution (0.100-2.0% v/v) and N,N,N',N'-tetramethylethylenediamine (0.020-1.0% v/v) are then added to initiate the polymerization. The solution is stirred gently five to seven times by hand to mix all the components and poured immediately into a mould. The polymerization occurs at reaction temperature for one hundred and twenty to one hundred and eighty minutes. The resulting hydrogel is immersed in distilled water for a three days changing the water every six to eight hours to remove any unreacted monomers.

A vacuum pump can be used to deoxygenize the monomer solution. This is to remove any oxygen dissolved during the stirring of the acrylamide and N,N'-methylenebisacrylamide.

Example 8

A polyacrylamide hydrogel with a highly hydrophilic structure is obtained by using polyethylene glycol diacrylate (PEGDA) during the polymerization reaction. The hydrogel is synthetized using the following reactants: polyethylene glycol diacrylate, acrylamide, N,N'-methylenebisacrylamide (MBAAm), N,N,N',N'-tetramethylethylenediamine (TEMED) and ammonium persulfate (APS).

A known volume of ammonium persulfate solution with a concentration of between 0.020-0.100 moles is prepared using distilled water. A solution of N,N,N',N'-tetramethylethylenediamine of between 0.10-0.50 moles is also prepared. The ammonium persulfate solution and N,N,N',N'-tetramethylethylenediamine solution will be the redox initiator system. The reactants were dissolved in distilled water at the following concentrations: acrylamide at between 5% and 30%, ammonium persulfate solution at between 5% and 30% and N,N'-methylenebisacrylamide at between 1.0% and 5.0%. The polyethylene glycol diacrylate (2% to 30% w/v) is then dissolved in the monomer solution and stirred slowly until is completely dissolved. Once the polyethylene glycol diacrylate is dissolved N,N',N'-tetramethylethylenediamine solution is added at a concentration of between 5% and 20% v/v and stirred by hand five to eight times. The solution is then immediately poured into a mould and the polymerization was conducted for twelve hours. Once the polymerization is complete the resulting hydrogel is submerged in distilled water to remove any unreacted monomers and the water changed every six to eight hours hours for three days.

A vacuum pump can be used to deoxygenize the monomer solution.

Glycerin-Based Wettable Materials

A glycerin-based gel may be prepared in an aqueous solution of glycerin with a wt. % of glycerin varying according to the thermal requirements of the application. The wettable material may be a glycerin gel which repels resin and is able to withstand high temperatures.

It will be understood by a person skilled in the art that many of the details provided above are by way of example only, and are not intended to limit the scope of the invention which is to be determined with reference to the following claims.

What is claimed is:

1. A stereolithography system, comprising:
   an emitting device;
   a tank disposed above the emitting device, the tank having an optically transparent bottom wall;
   a linear stage extending away from the tank and a carrier platform moveable along the linear stage away from the tank; and
   a hydrogel overlaying the optically transparent bottom wall of the tank within the tank.

2. The stereolithography system as claimed in claim 1 wherein the hydrogel further includes hydrogen peroxide.

3. The stereolithography system as claimed in claim 1 wherein the hydrogel further includes a hydrogen donor and an oxygen scavenger.

4. The stereolithography system as claimed in claim 1 wherein the hydrogel includes glycerin.

5. The stereolithography system as claimed in claim 1 wherein the hydrogel includes a U V inhibitor.

6. The stereolithography system as claimed in claim 1 wherein the hydrogel is coated on the optically transparent bottom wall of the tank.

7. The stereolithography system as claimed in claim 1 wherein the hydrogel is a membrane that overlays the optically transparent bottom wall of the tank.

8. The stereolithography system as claimed in claim 1 wherein the hydrogel is adhered to the optically transparent bottom wall of the tank using adhesive applied in a pattern having intersecting lines.

9. The stereolithography system as claimed in claim 1 wherein a nanostructure of a surface of the hydrogel is a vertically aligned surface or a hierarchically structured surface, or a combination thereof.

10. The stereolithography system as claimed claim 1 wherein a nanostructure of a surface of the hydrogel includes a plurality of projections which have a top diameter of between 5 microns and 15 microns and are spaced less than 10 microns apart.

* * * * *